United States Patent
Matsunaga et al.

(10) Patent No.: US 8,158,332 B2
(45) Date of Patent: Apr. 17, 2012

(54) METHOD OF MANUFACTURING A SEMICONDUCTOR DEVICE

(75) Inventors: Kentaro Matsunaga, Tokyo (JP); Tomoya Oori, Kanagawa (JP); Eishi Shiobara, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 227 days.

(21) Appl. No.: 12/689,830

(22) Filed: Jan. 19, 2010

(65) Prior Publication Data
US 2010/0183982 A1 Jul. 22, 2010

(30) Foreign Application Priority Data
Jan. 20, 2009 (JP) .................................. 2009-9567

(51) Int. Cl.
*G03C 5/00* (2006.01)
(52) U.S. Cl. ........ 430/312; 430/313; 430/314; 430/315; 430/328; 430/330; 430/394
(58) Field of Classification Search .................. 430/312, 430/313, 314, 315, 328, 330, 394
See application file for complete search history.

(56) References Cited

U.S. PATENT DOCUMENTS
7,790,357 B2 * 9/2010 Jung .............................. 430/311
2009/0305166 A1 12/2009 Shiobara et al.

FOREIGN PATENT DOCUMENTS
JP 03-270227 12/1991
JP 2005-197349 7/2005

* cited by examiner

*Primary Examiner* — Christopher Young
(74) *Attorney, Agent, or Firm* — Finnegan, Henderson, Farabow, Garrett & Dunner, L.L.P.

(57) ABSTRACT

A method of fabricating a semiconductor device according to an embodiment includes: forming a first resist pattern made of a first resist material on a workpiece material; irradiating an energy beam onto the first resist pattern, the energy beam exposing the first resist material to light; performing a treatment for improving resistance the first resist pattern after irradiation of the energy beam; forming a coating film on the workpiece material so as to cover the first resist pattern; and forming a second resist pattern made of a second resist material on the coating film after the treatment.

20 Claims, 19 Drawing Sheets

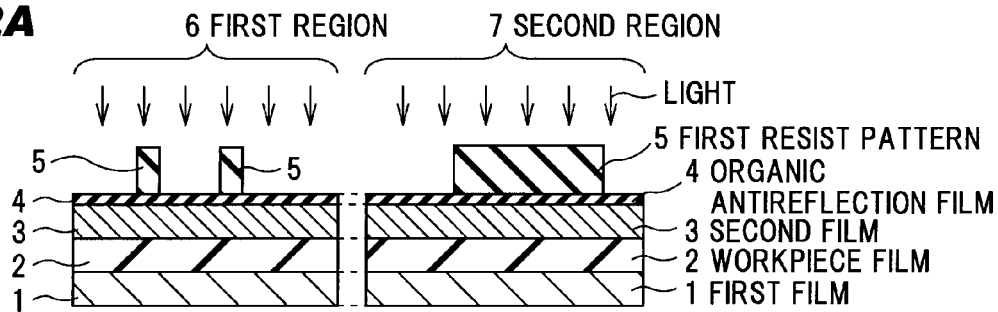
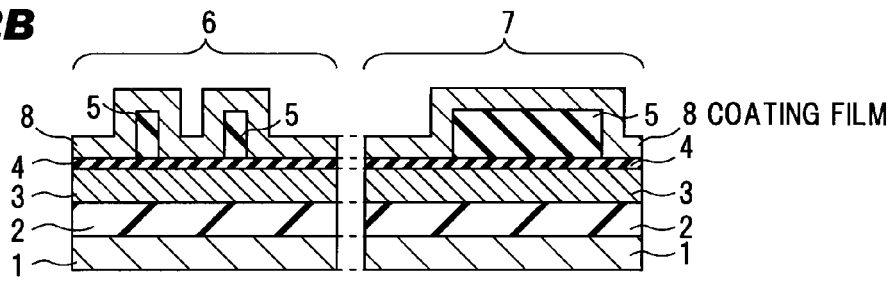
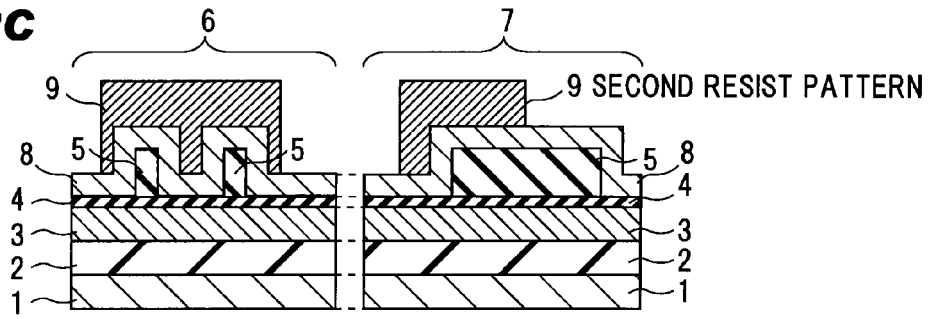
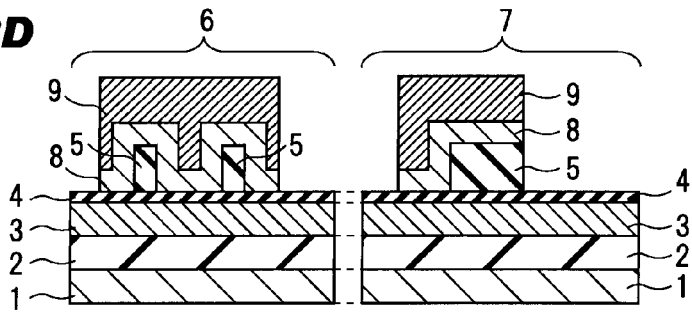
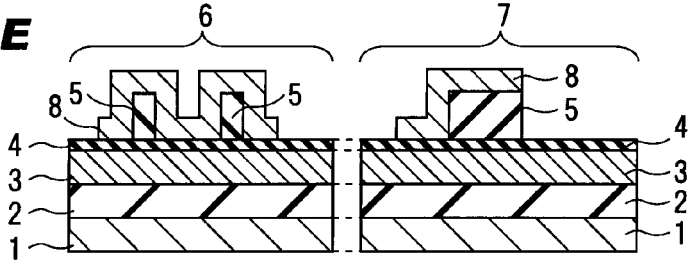

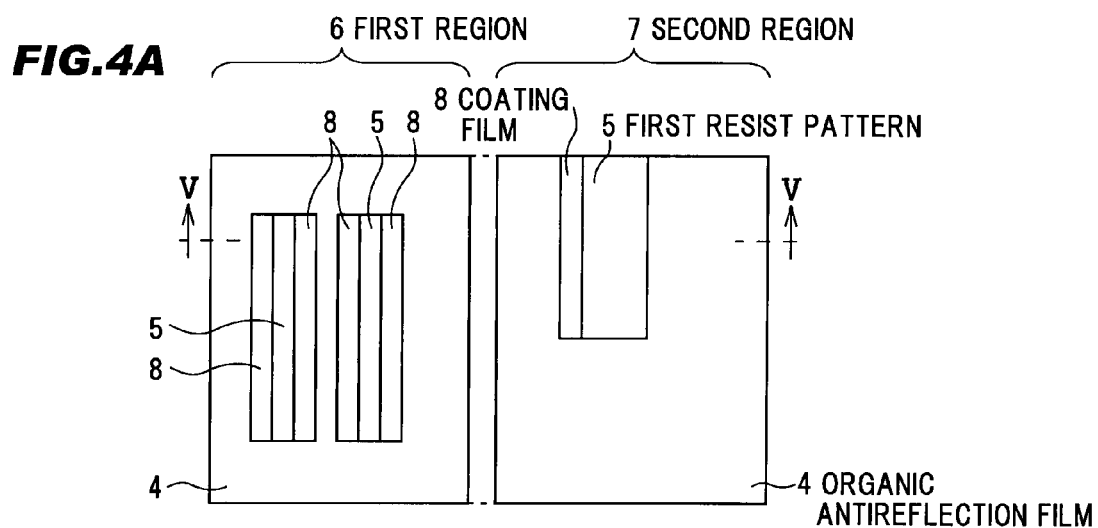
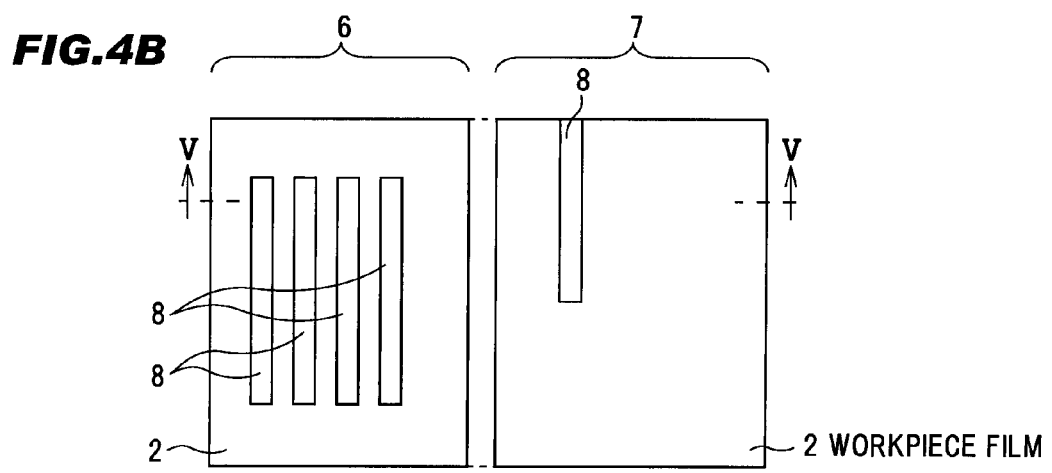

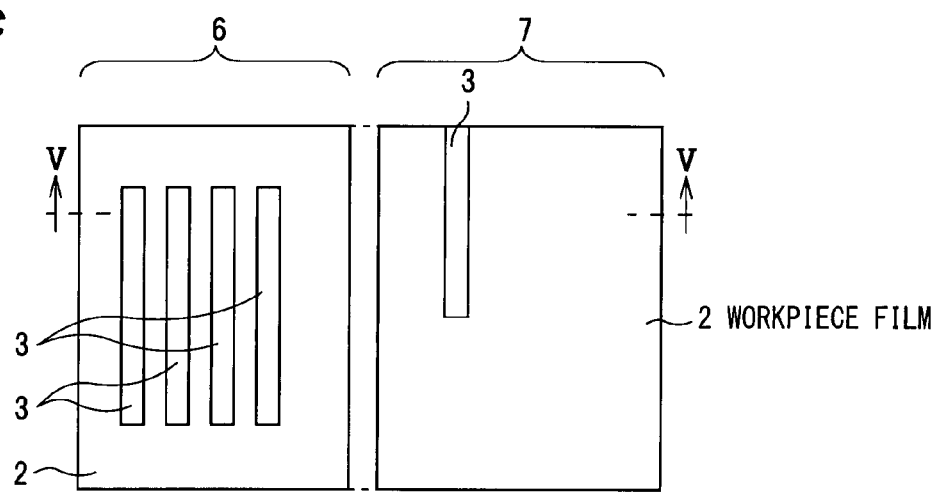
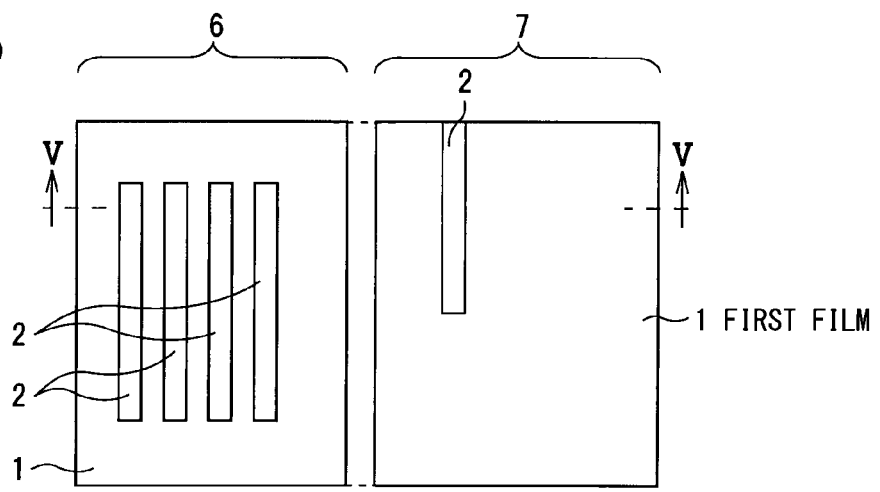

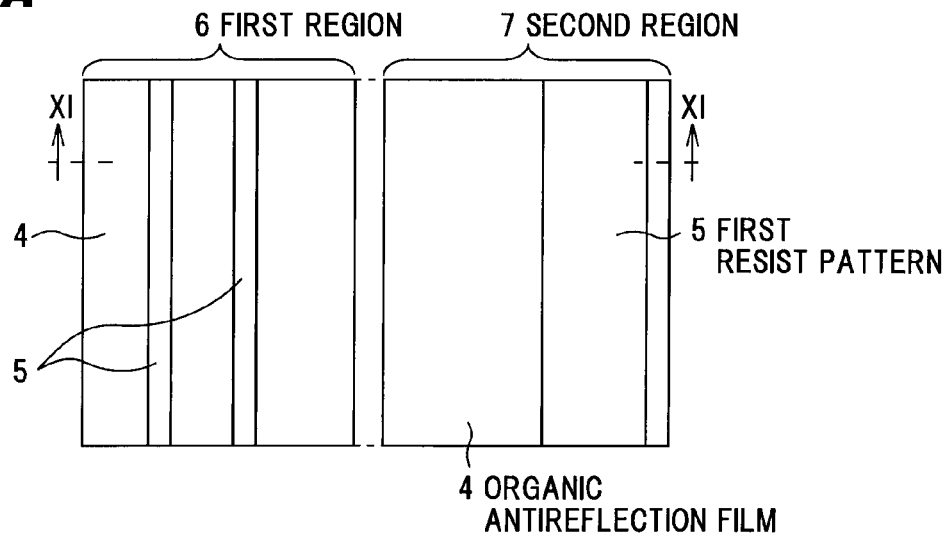
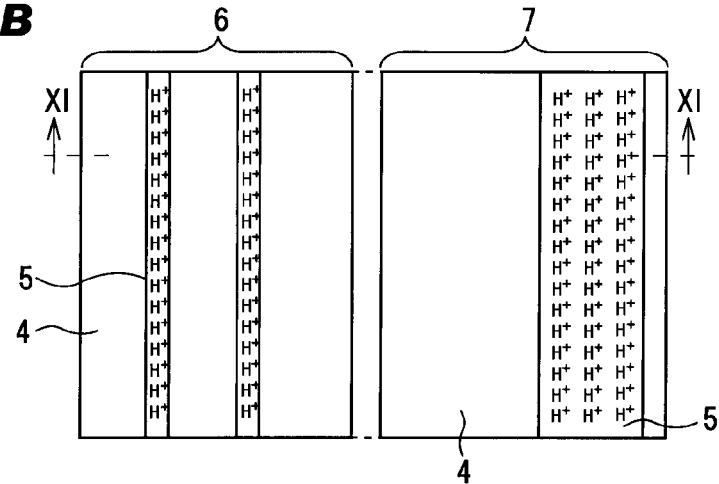
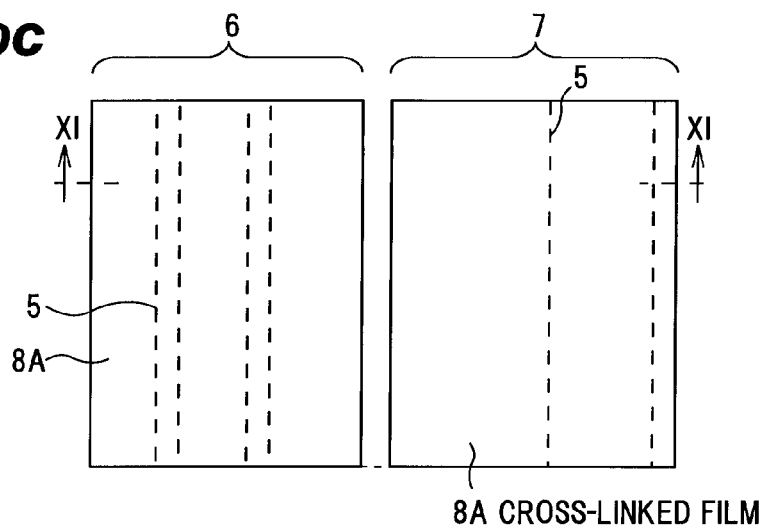

6 FIRST REGION / 7 SECOND REGION
5 FIRST RESIST PATTERN
4 ORGANIC ANTIREFLECTION FILM
3 SECOND FILM
2 WORKPIECE FILM
1 FIRST FILM

LIGHT

8A CROSS-LINKED FILM

9 SECOND RESIST PATTERN

METHOD OF MANUFACTURING A SEMICONDUCTOR DEVICE

CROSS-REFERENCE TO RELATED APPLICATIONS

This application is based upon and claims the benefit of priority from prior Japanese Patent Application No. 2009-009567, filed on Jan. 20, 2009, the entire contents of which are incorporated herein by reference.

BACKGROUND

In recent years, a method of forming a pattern having a size less than exposure resolution limit of lithography is required in accordance with miniaturization of semiconductor devices.

As one of such methods, a fine pattern formation method is known which includes forming a base film on a substrate, forming a first resist pattern on the base film, irradiating vacuum ultraviolet rays on the first resist pattern, forming a second resist pattern on the base film, etching the base film using the first and second resist patterns as a mask, and removing the first and second resist patterns. This method, for example, is disclosed in JP-A 2005-197349.

By using the fine pattern formation method, it is possible to improve various resistances such as etching resistance using a cure effect by the vacuum ultraviolet rays, and to form a sparse pattern in which deformation or "falling" is suppressed.

BRIEF SUMMARY

A method of fabricating a semiconductor device according to an embodiment includes: forming a first resist pattern made of a first resist material on a workpiece material; irradiating an energy beam on the first resist pattern, the energy beam exposing the first resist material to light; performing a treatment for improving resistance of the first resist pattern after irradiation of the energy beam; forming a coating film on the workpiece material so as to cover the first resist pattern; and forming a second resist pattern made of a second resist material on the coating film after the treatment.

A method of fabricating a semiconductor device according to another embodiment includes: forming a first resist material on a workpiece material; forming a first resist pattern by irradiating an energy beam within a first photosensitive range on the first resist material; forming a coating film on the workpiece material so as to cover the first resist pattern; forming a second resist material on the coating film, a material of the second resist material being different from that of the first resist material; and forming a second resist pattern by irradiating an energy beam within a second photosensitive range different from the first photosensitive range on the second resist material.

A method of fabricating a semiconductor device according to another embodiment includes: forming a first resist material on a workpiece material; forming a first resist pattern by irradiating an energy beam on the first resist material and performing a baking process of the first resist material within a first temperature range; forming a coating film on the workpiece material so as to cover the first resist pattern; forming a second resist material on the coating film, a material of the second resist material being different from that of the first resist material; and forming a second resist pattern by irradiating an energy beam on the second resist material and performing a baking process of the second resist material within a second temperature range.

BRIEF DESCRIPTION OF THE DRAWING

FIGS. 2A to 2E are cross sectional views showing processes for fabricating the semiconductor device according to the first embodiment taken along the line II-II of FIGS. 1A to 1E;

FIGS. 4A to 4D are top views showing processes for fabricating a semiconductor device according to a second embodiment;

FIGS. 10A to 10I are top views showing processes for fabricating a semiconductor device according to a tenth embodiment.

DETAILED DESCRIPTION

First Embodiment

Figure 3A:
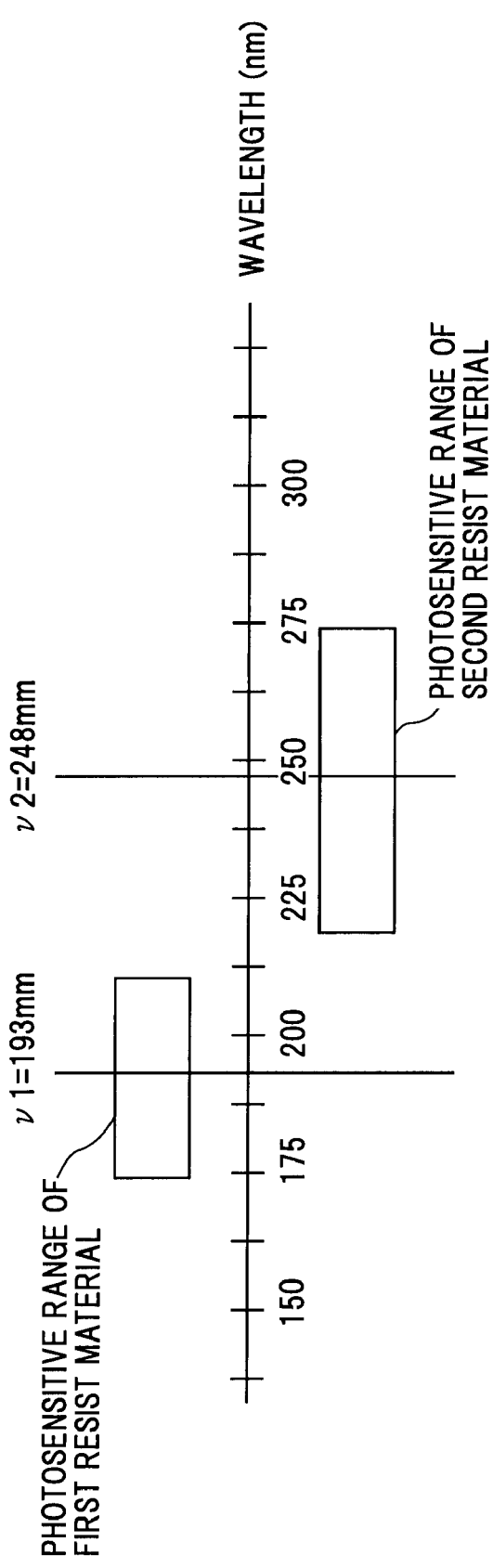
FIG. 3A is a diagram showing photosensitive ranges of first and second resist materials according to the first embodiment and FIG. 3B is a diagram showing reaction temperature ranges of the first and second resist materials.
Figure 3B:
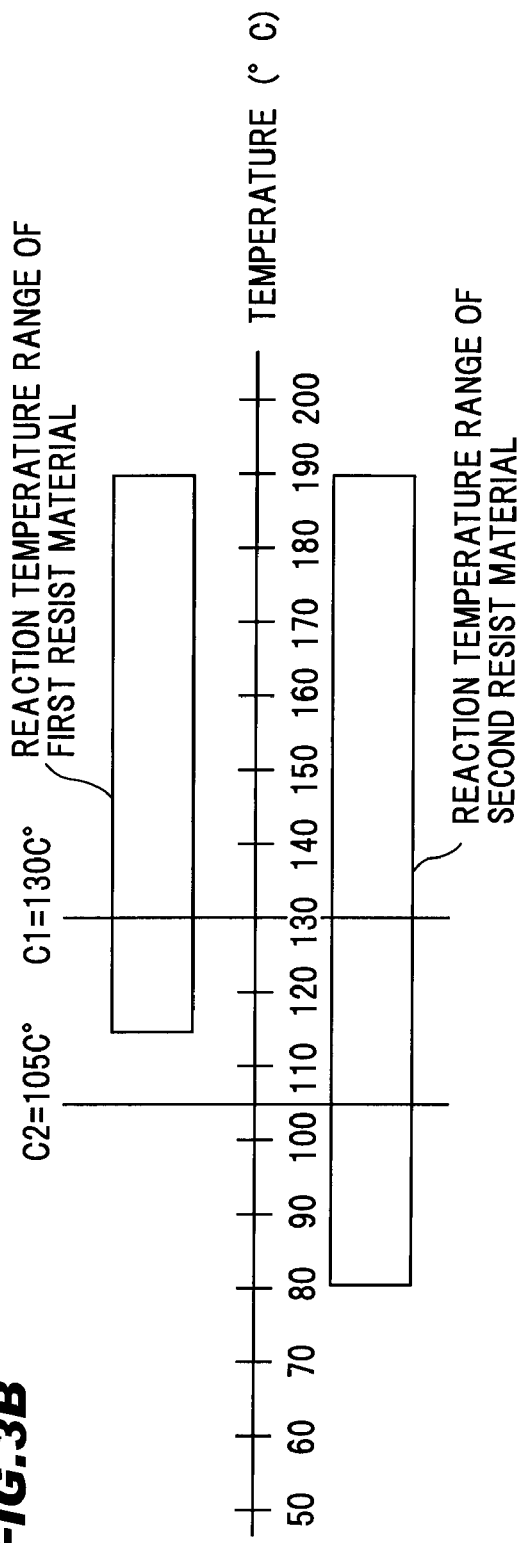

FIGS. 1A to 1E are top views showing processes for fabricating a semiconductor device according to a first embodiment. FIGS. 2A to 2E are cross sectional views showing processes for fabricating the semiconductor device according to the first embodiment taken along the line II-II of FIGS. 1A to 1E. FIG. 3A is a diagram showing photosensitive ranges of first and second resist materials according to the first embodiment. FIG. 3B is a diagram showing reaction temperature ranges of the first and second resist materials. Note that, the left side of FIGS. 1A to 1E and FIGS. 2A to 2E each represents a first region 6 in which a microscopic pattern of a first resist pattern 5 is formed, and the right side represents a second region 7 in which a large pattern of the first resist pattern 5 is formed.

Firstly, a first film 1, a workpiece film 2 as a workpiece material, a second film 3 and an organic antireflection film 4 are sequentially formed on a non-illustrated semiconductor substrate, and a first resist pattern 5 having a predetermined pattern is formed on the organic antireflection film 4. In detail, for example, a chemically-amplified ArF resist (a first resist material) is formed 100 nm thick on the organic antireflection film 4. Next, a line-and-space pattern with, e.g., a pitch of 80 nm and a line width of 40 nm is formed on the first resist material in a first region 6 via a reticle by an ArF immersion exposure apparatus of NA 1.3 or more. Following this, Post Exposure Bake (PEB), which is one of baking processes performed after exposure to light and before development, is performed on a hot plate, and the first resist pattern 5 is formed by the sequential development.

The chemically-amplified resist is schematically configured to include a base resin having dissolution inhibitor added thereto and Photo Acid Generator (PAG). In the chemically-amplified resist, acid created from the PAG (acid component) is generated by irradiation of light (energy beam) and the dissolution inhibitor is removed from the base resin by the PEB subsequently performed thereafter, and alkali solubility thereby appears. Note that, the reaction temperature range indicates a range of a temperature where the dissolution inhibitor is removed from the base resin by the PEB and the alkali solubility appears in the resist material.

For the first resist material, a chemically-amplified ArF resist of which base resin is, e.g., a side-chain alicyclic resin or a main-chain alicyclic resin is used. In addition, the photosensitive range of the first resist material in the present embodiment is 175-210 nm as shown in FIG. 3A, and the reaction temperature range by the PEB is 115-190° C. as shown in FIG. 3B. On the first resist material, for example, ArF excimer laser with a wavelength $v1$ (193 nm) is irradiated as an energy beam, and subsequently, the PEB is performed by a hot plate which is set to a temperature C1 (130° C.). Note that, the photosensitive range indicates a range where the resist material is exposed to light by the irradiated light, i.e., a photosensitive wavelength range in which acid is created from the PAG.

Next, an acid resin aqueous solution is applied on the first resist pattern 5 and is heated on a hot plate at 150° C. for 60 seconds. Following this, the line width of the first resist pattern 5 is slimmed to 20 nm by developing the first resist pattern 5 in a TMAH (Tetramethylammonium Hydroxide) aqueous solution of 2.38 wt % for 30 seconds and rinsing with pure water, thereby forming the first resist pattern 5 with a line width of 20 nm in the first region 5. Note that, the slimming can be also achieved by partially carrying out isotropic etching when the below-described organic antireflection film 4 is dry-etched. Alternatively, it is possible to slim by a method of irradiating light at an exposure amount greater than the exposure amount by which a ratio of a line width to a space width becomes 1:1 (overdose method). For reducing the slimming amount, a desired pattern may be formed by preliminarily adjusting exposure conditions or mask size so that the first resist pattern 5 is thinner than 40 nm in line width.

Here, for example, a silicone oxide film, a silicon nitride film or a polysilicon film, etc., is used for the first film 1 depending on the intended use. Alternatively, the first film 1 may be composed of plural films, or the workpiece film 2 may be formed directly on the semiconductor substrate without forming the first film 1.

The workpiece film 2 is a film made of, e.g., a silicone oxide film. The workpiece film 2 is formed by, e.g., thermal oxidation method or CVD method, and a film thickness thereof is 200 nm. Alternatively, the workpiece film 2 may be a film composed of plural layers, and may be, e.g., a control electrode film, an inter-electrode insulating film and a floating gate electrode film which compose a stack gate structure of flash memory. Furthermore, the first film 1 or the semiconductor substrate itself can be an object to be processed.

The second film 3 is, e.g., a carbon film consisting mainly of carbon. The second film 3 is formed by, e.g., CVD method or sputtering method, and a film thickness thereof is 200 nm.

Figure 1A:
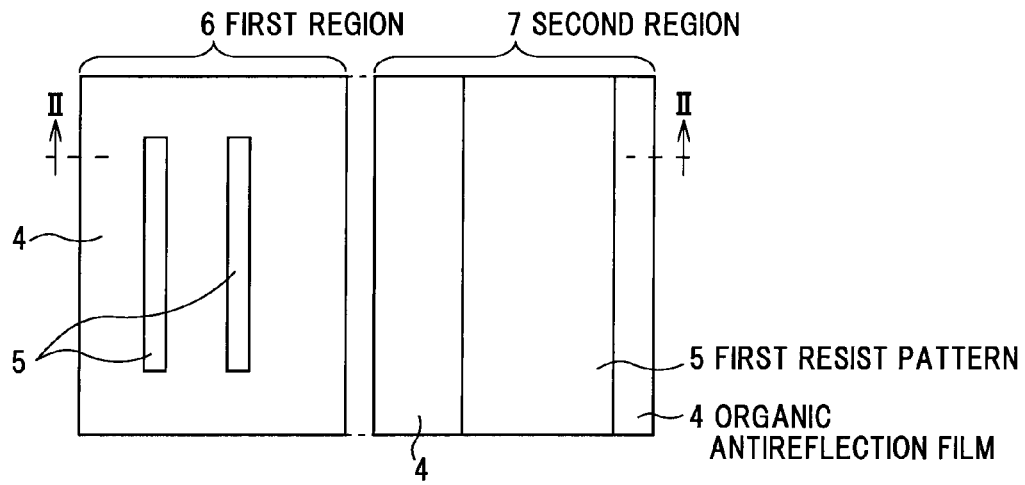
FIGS. 1A to 1E are top views showing processes for fabricating a semiconductor device according to a first embodiment.

Next, as shown in FIGS. 1A and 2A, an ArF excimer laser with a wavelength $v1$ (193 nm) is irradiated on the first resist pattern 5 and the PEB is subsequently performed by a hot plate which is set to the temperature C1 (130° C.), thereby deactivating photoreactivity of the first resist pattern 5. Here, deactivating the photoreactivity (deactivation) is to consume or/and neutralize acid generated in the resist material for preventing the alkali solubility from newly appearing even if a photo irradiation process or photo irradiation and a baking process are performed after the deactivation, in other words, to improve the resistance of the first resist pattern 5.

Here, as shown in FIG. 3B, the temperature C1 (130° C.) is desirably a temperature in which a deprotection reaction of the first resist pattern 5 occurs and the first resist pattern 5 does not deform or decompose. Note that, the photo irradiation and the PEB may be simultaneously performed.

Figure 1B:
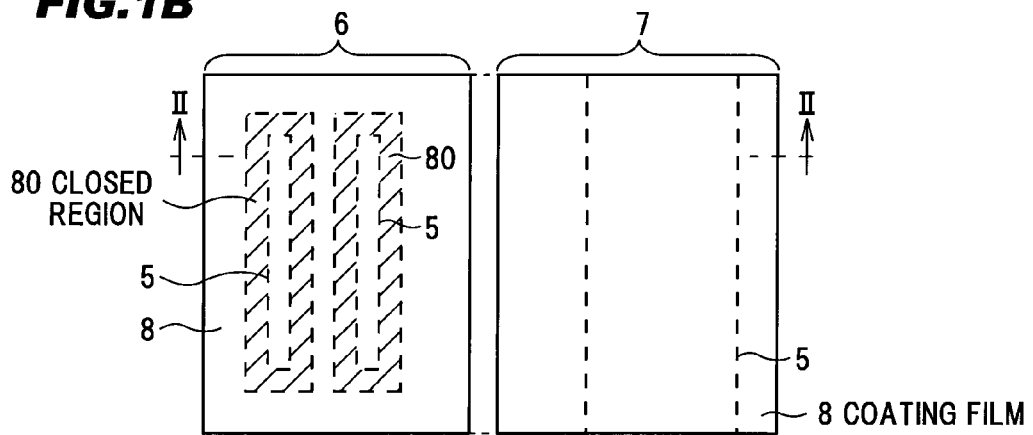

Next, as shown in FIGS. 1B and 2B, a coating film 8 made of a material containing silicon is formed on the slimed first resist pattern 5. In detail, a silicon oxide film as the coating film 8 is formed 20 nm thick on the first resist pattern 5 at a room temperature.

Here, the coating film 8 is formed by, e.g., CVD method, sputtering method or coating method, etc. The coating film 8 is, e.g., formed of silicon oxide film, amorphous silicon film or silicon nitride film, etc., by the CVD method, and a temperature for forming the film is desirably 200° C. or less in order not to deform or decompose the first resist pattern 5. Note that, the coating film 8 is formed by the coating method using silane compound, silazane compound or siloxane compound, etc., to be more precise, Spin on Glass (SOG) material, polysilane compound, polysilazane compound or silicon containing negative resist, etc.

Figure 1C:
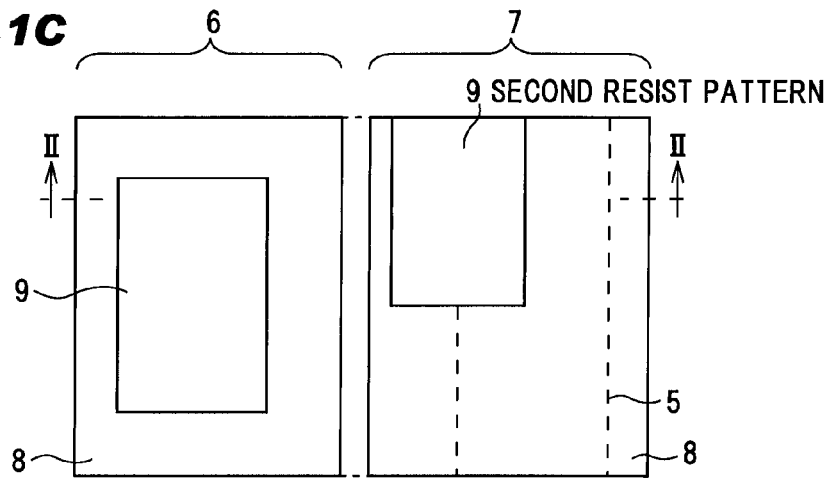

Next, as shown in FIGS. 1C and 2C, a second resist pattern 9 is formed on the coating film 8. In detail, for example, a chemically-amplified KrF resist (second resist material) is formed 300 nm thick on the coating film 8. A desired pattern is transferred to the first region 6 and a second region 7 via a reticle by a KrF immersion exposure apparatus, the PEB is performed on a hot plate, and the second resist pattern 9 is formed by the sequential development. At this time, the second resist pattern 9 is formed so as to be located on at least a portion of an upper portion of the first resist pattern 5. As shown in the figure, the second resist pattern 9 is formed so as to partially cover a portion of each first resist pattern 5 formed in the first region 6 and a second region 7 via the coating film 8.

The second resist material is made of, e.g., chemically-amplified KrF resist of which base resin is polyhydroxystyrene. In addition, the photosensitive range of the first resist material in the present embodiment is 220-275 nm as shown in FIG. 3A, and the reaction temperature range by the PEB is 80-190° C. as shown in FIG. 3B. On the second resist material, for example, KrF excimer laser with a wavelength $v2$ (248 nm) is irradiated, and subsequently, the PEB is performed by a hot plate which is set to a temperature C2 (105° C.). The second resist material is made of a material with the photosensitive wavelength and/or the reaction temperature different from those of the first resist material. Note that, the first and second resist materials may be the same material when, e.g., a pattern is formed by removing one resist film in a state that another resist material is coated. It is possible to use the same material for the first and second resist materials in case that, for example, after a resist pattern is formed on the first resist material, a film is formed so as to cover the resist pattern and the second resist material is applied on the film for forming a resist pattern on the second resist material.

Figure 1D:
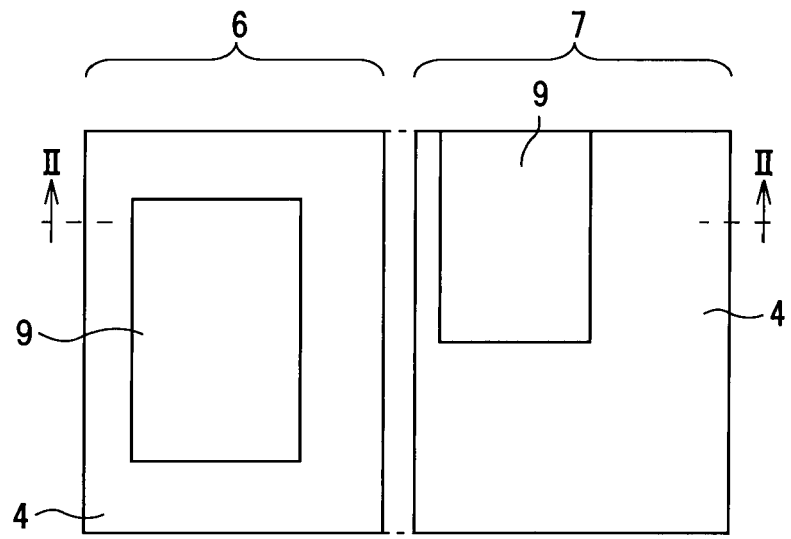

Next, as shown in FIGS. 1D and 2D, unnecessary portions of the coating film 8 and the first resist pattern 5 are removed by plasma containing fluorine using the second resist pattern 9 as a mask.

Figure 1E:
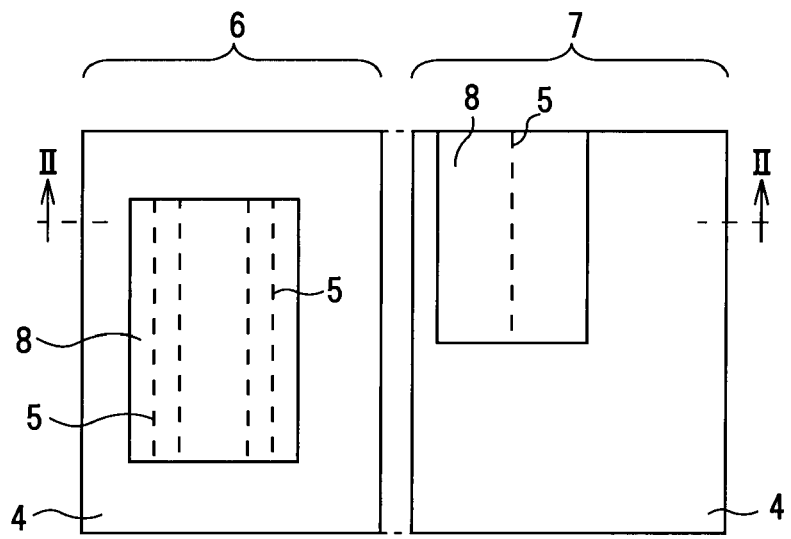

Next, as shown in FIGS. 1E and 2E, the second resist pattern 9 is removed and the coating film 8 is exposed, thereby forming a desired pattern.

Effect of the First Embodiment

According to the first embodiment, the following effects are obtained.

(1) Since light with a photosensitive wavelength of the first resist pattern is irradiated on the first resist pattern and the photoreactivity of the first resist pattern is subsequently deactivated by the PEB, it is possible to suppress damage or defects of the first resist pattern due to the irradiation of the light at the time of forming the second resist pattern.

(2) Since it is possible to suppress damage or defects of the first resist pattern, the yield is improved.

Second Embodiment

The present embodiment is different from the first embodiment in that, following the fabrication processes shown in the first embodiment, a line-and-space pattern having a size less than exposure resolution limit of lithography is formed. Following is an explanation for a process of forming a line-and-space pattern with a pitch of 40 nm and a line width of 20 nm. Note that, in each embodiment described hereinafter, a portion which has the same configuration and function as the first embodiment is given the same reference numeral as the first embodiment, and the explanation thereof will be omitted or simplified. In addition, the explanation for the same fabrication process as other embodiments will be simplified.

FIGS. 4A to 4D are top views showing processes for fabricating a semiconductor device according to a second embodiment. FIGS. 5A to 5D are cross sectional views showing processes for fabricating the semiconductor device according to the second embodiment taken along the line V-V of FIGS. 4A to 4D.

Figure 5A:
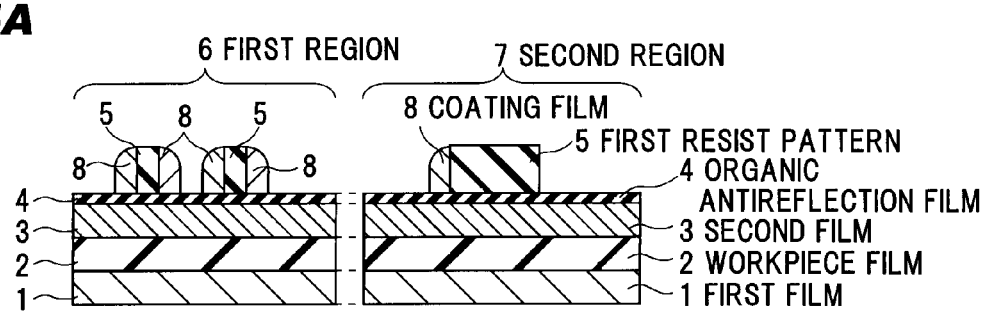
FIGS. 5A to 5D are cross sectional views showing processes for fabricating the semiconductor device according to the second embodiment taken along the V-V of FIGS. 4A to 4D.

Firstly, after the processes which have been explained using FIGS. 1A to 1E and FIGS. 2A to 2E in the first embodiment are performed, the coating film 8 is etched back about 20 nm by the plasma containing fluorine for exposing the first resist pattern 5 as shown in FIGS. 4A and 5A.

Here, as shown in FIGS. 4A and 5A, the coating film 8 is a sidewall (a sidewall pattern) of the first resist pattern 5 as a core. In addition, an end portion of a closed region 80 formed on a line edge side surface of the first resist pattern 5 is included in the unnecessary portion of the coating film 8 which is removed using the second resist pattern 9 as a mask. In other word, a close loop pattern made of the close region 80 is cut. The coating film 8 turned into the sidewall can be used as, e.g., a mask for forming a wiring pattern.

Figure 5B:
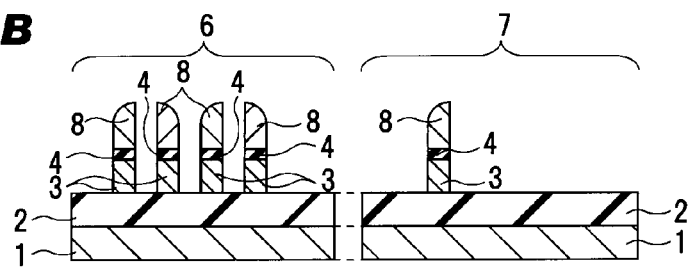

Next, as shown in FIGS. 4B and 5B, the first resist pattern 5, the organic antireflection film 4 and the second film 3 are, e.g., simultaneously anisotropically etched under the same processing conditions using plasma containing oxygen.

Figure 5C:
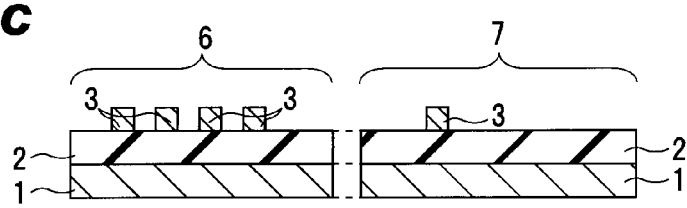

Next, as shown in FIGS. 4C and 5C, the coating film 8 and the organic antireflection film 4 are removed. As a result, a line-and-space pattern with a pitch of 40 nm and a line width of 20 nm, in which an aspect ratio is high and a pattern falling is suppressed, is formed by the second film 3 in the first region 6. Meanwhile, a pattern with a line width of 20 nm, in which an aspect ratio is high and a pattern falling is suppressed, is formed by the second film 3 in the second region 7. Note that, the processing of the first resist pattern 5 includes the removal thereof.

Figure 5D:
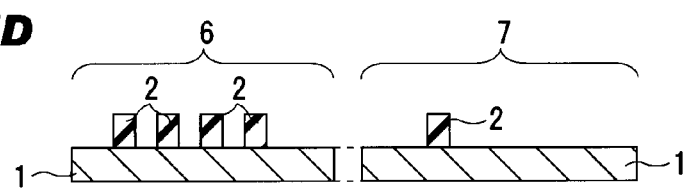

Next, as shown in FIGS. 4D and 5D, the pattern is transferred to the workpiece film 2 by dry etching using the second film 3 as a mask. Following this, the second film 3 is removed by, e.g., an oxygen ashing method and a line-and-space pattern with a pitch of 40 nm and a line width of 20 nm is formed on the first film 1 in the first region 6. Meanwhile, a pattern with a line width of 20 nm is formed on the first film 1 in the second region 7. Note that, depending on the selection of the material, it is possible to transfer the pattern to the workpiece film 2 using the coating film 8 as a mask before the removal thereof.

Effect of the Second Embodiment

According to the second embodiment, the following effects are obtained in addition to the effects in the first embodiment.

(1) Since the second resist pattern is formed after the photoreactivity of the first resist pattern is deactivated, when the pattern having a size exceeding the exposure resolution limit of lithography is formed, it is possible to etch the workpiece film using a mask in which the aspect ratio is high and the pattern falling is unlikely to occur.

(2) Since the first resist material can be used as a core, it is possible to reduce the number of processes compared with the case that the core is formed of another film.

(3) It becomes possible to perform the processes from the removal of the core to the removal of the second film in one dry etching apparatus, thus, it is possible to suppress the generation of defects due to particle adhesion, etc., during conveyance between processes, and to reduce a decrease in the yield.

(4) Dispersion in size due to reduction of the number of processes is reduced and the yield is improved.

(5) Dry etching resistance is not necessary for the first and second resist materials, and it is thereby possible to use a resist material with high resolution.

Third Embodiment

The present embodiment is different from other embodiments in that, after the light exposing the first resist pattern is irradiated, the photoreactivity of the first resist pattern is deactivated by exposing the first resist pattern to a nitrogen-containing compound.

Figure 6:
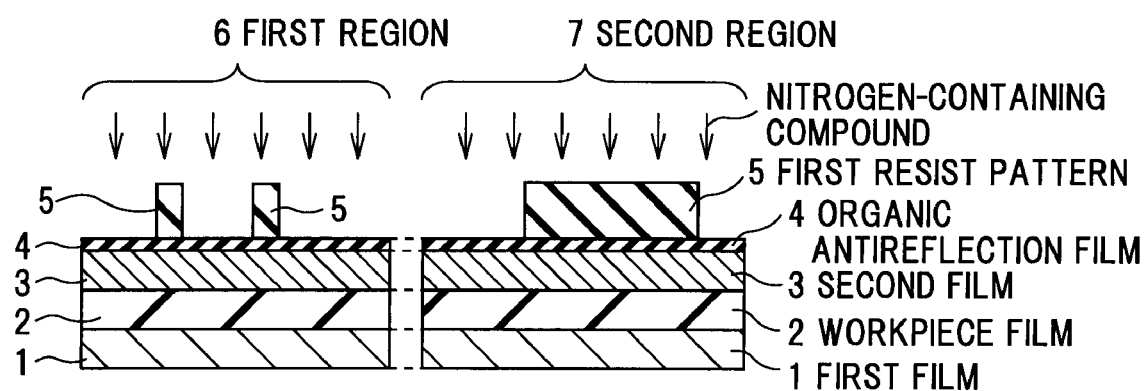
FIG. 6 is a cross sectional view showing processes for fabricating a semiconductor device according to a third embodiment.

FIG. 6 is a cross sectional view showing processes for fabricating a semiconductor device according to a third embodiment.

Firstly, the processes until the process explained using FIGS. 1A and 2A in the first embodiment are carried out, and for example, ArF excimer laser with a wavelength v1 (193 nm) is irradiated on the first resist pattern 5.

Following this, as shown in FIG. 6, a nitrogen-containing compound aqueous solution is applied to the first resist pattern 5 and the first resist pattern 5 is spin-dried.

Here, a nitrogen-containing compound 10 is, e.g., tertiary amine compound such as alkylamines, cycloalkylamines, aromatic amines and alkanolamines, amide group-containing compound such as N-t-butoxycarbonyl group-containing amino compound, quaternary ammonium hydroxide compound such as tetra-n-propylammonium hydroxide and tetran-butylammonium hydroxide, or nitrogen-containing heterocyclic compound such as pyridines, piperazines and midazoles.

In addition, a method of exposing the first resist pattern 5 to the nitrogen-containing compound aqueous solution may be a method of coating with the above-mentioned nitrogen-containing compound aqueous solution, or alternatively, the first resist pattern 5 may be exposed in an atmosphere containing the above-mentioned nitrogen-containing compound. Note that, a process, in which pure water or organic solvent not dissolving the first resist pattern 5 is applied on the first resist pattern 5 and a reaction residue is cleaned by spin dry, may be added after the process of exposing the first resist pattern 5 to the nitrogen-containing compound aqueous solution.

Next, the processes which have been explained using FIGS. 1B to 1E and FIGS. 2B to 2E in the first embodiment are carried out for forming a desired pattern.

Effect of the Third Embodiment

According to the third embodiment, the following effects are obtained.

(1) Since the photoreactivity of the first resist pattern can be deactivated by exposing the first resist pattern to the aqueous solution or atmosphere of nitrogen-containing compound, it is possible to suppress damage or defects of the first resist pattern due to the irradiation of the light at the time of forming the second pattern.

(2) Since it is possible to suppress damage or defects of the first resist pattern, the yield is improved.

Fourth Embodiment

The present embodiment is different from the other embodiment in that, following the fabrication processes shown in the third embodiment, a line-and-space pattern having a size less than exposure resolution limit of lithography is formed. A process of forming a line-and-space pattern with a pitch of 40 nm and a line width of 20 nm in a first region will be explained hereinafter.

Firstly, after the processes until the formation of a desired pattern in the third embodiment are carried out, the processes which have been explained using FIGS. 4A to 4D and FIGS. 5A to 5D in the second embodiment are carried out, thereby forming a line-and-space pattern with a pitch of 40 nm and a line width of 20 nm on the first film 1 in the first region 6 and a pattern with a line width of 20 nm on the first film 1 in the second region 7.

Effect of the Fourth Embodiment

According to the fourth embodiment, the following effects are obtained in addition to the same effects in the second and third embodiments.

Since the second resist pattern is formed after the photoreactivity of the first resist pattern is deactivated by exposing the aqueous solution or atmosphere of the first resist pattern to nitrogen-containing compound, it is possible to suppress damage or defects of the first resist pattern and to form a pattern having a size exceeding the exposure resolution limit of lithography.

Fifth Embodiment

The present embodiment is different from the other embodiments in that the photoreactivity of the first resist pattern is not deactivated and the second resist pattern is formed by light with a wavelength not exposing the first resist material.

FIGS. 7A to 7E are cross sectional views showing processes for fabricating a semiconductor device according to a fifth embodiment.

Firstly, a first film 1, a workpiece film 2, a second film 3 and an organic antireflection film 4 are sequentially formed on a non-illustrated semiconductor substrate. Following this, a first resist pattern 5 is formed on the organic antireflection film 4.

The photosensitive range of the first resist material for forming the first resist pattern 5 (e.g., a chemically-amplified ArF resist) is 175-210 nm as shown in FIG. 3A, and the reaction temperature range thereof by the PEB is 115-190° C. as shown in FIG. 3B. On the first resist material, for example, ArF excimer laser with a wavelength v1 (193 nm) is irradiated, and subsequently, the PEB is performed by a hot plate which is set to a temperature C1 (130° C.).

Figure 7A:
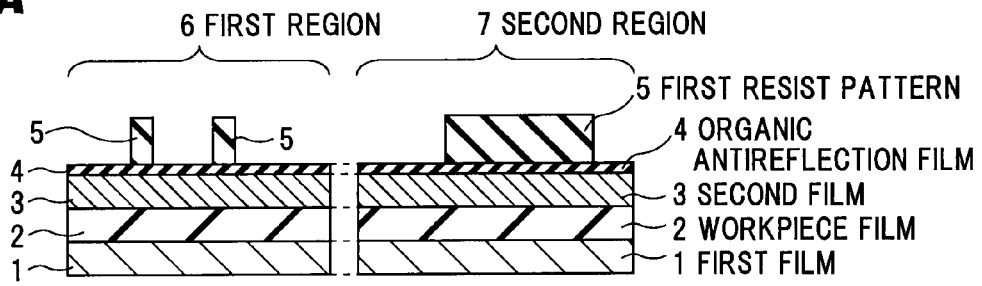
FIGS. 7A to 7E are cross sectional views showing processes for fabricating a semiconductor device according to a fifth embodiment.

Next, as shown in FIG. 7A, the line width of the first resist pattern 5 is slimmed to 20 nm, thereby forming the first resist pattern 5 with a line width of 20 nm.

Figure 7B:
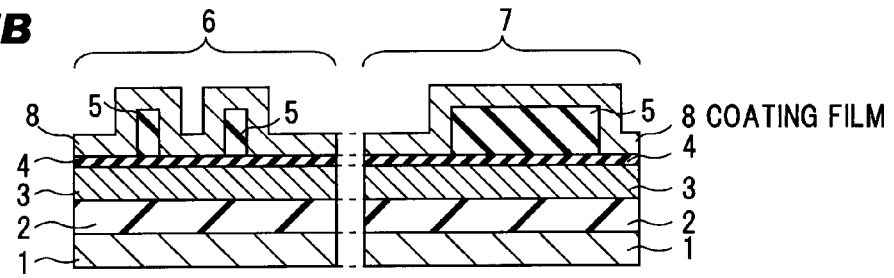

Next, as shown in FIG. 7B, the coating film 8 is formed on the slimmed first resist pattern 5.

Figure 7C:
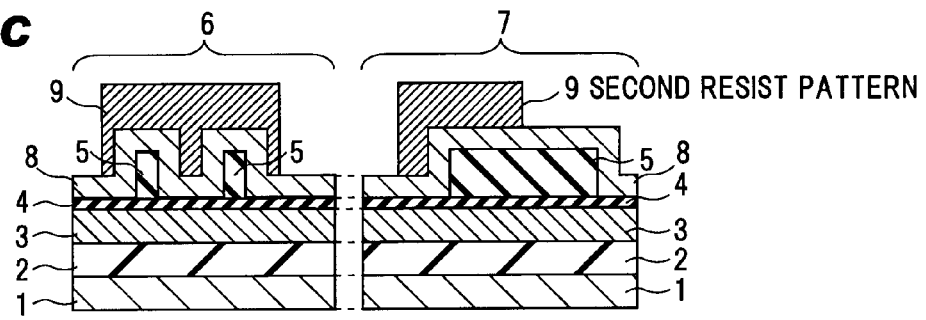

Next, as shown in FIG. 7C, the second resist pattern 9 is formed on the coating film 8 using a second resist material made of a material different from the first resist material (e.g., a chemically-amplified KrF resist).

Here, the photosensitive wavelength range of the second resist material for forming the second resist pattern 9 is 220-275 nm as shown in FIG. 3A, and the reaction temperature range thereof by the PEB is 80-190° C. as shown in FIG. 3B. On the second resist material, for example, KrF excimer laser with a wavelength v2 (248 nm) is irradiated, and subsequently, the PEB is performed by a hot plate which is set to the temperature C1 (130° C.) which is the same as the temperature C1 for the first resist material.

Since the wavelength that the first resist material is exposed to light is different from the second resist material, the first resist pattern 5 is not exposed by the irradiation of the light at the time of forming the second resist pattern 9. Therefore, even though the PEB is performed at the temperature C1 in which the first resist material reacts, damage or defects are not generated in the first resist pattern 5.

Figure 7D:
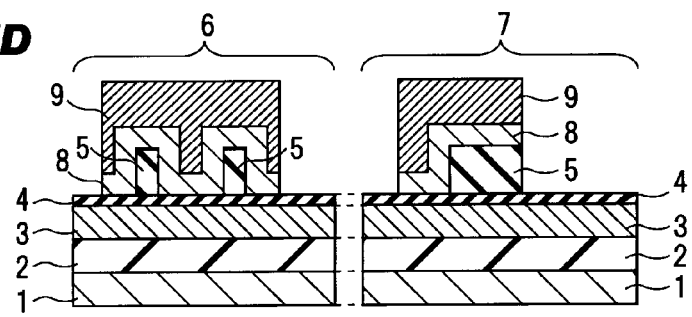

Next, as shown in FIG. 7D, unnecessary portions of the coating film 8 and the first resist pattern 5 are removed by plasma containing fluorine using the second resist pattern 9 as a mask.

Figure 7E:
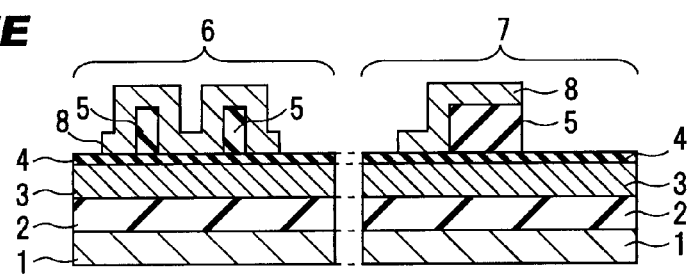

Next, as shown in FIG. 7E, the second resist pattern 9 is removed the coating film 8 is exposed, thereby forming a desired pattern.

Effect of the Fifth Embodiment

According to the fifth embodiment, the following effects are obtained.

(1) Since the first and second resist materials are made of materials having different photosensitive ranges and light with a wavelength not exposing the first resist pattern can be selected as a wavelength of the light irradiated at the time of forming the second resist pattern, it is possible to suppress damage or defects of the first resist pattern due to the irradiation of the light at the time of forming the second pattern.

(2) Since it is possible to suppress damage or defects of the first resist pattern, the yield is improved.

Sixth Embodiment

The present embodiment is different from the other embodiment in that, following the fabrication processes shown in the fifth embodiment, a line-and-space pattern having a size less than exposure resolution limit of lithography is formed. A process of forming a line-and-space pattern with a pitch of 40 nm and a line width of 20 nm in a first region will be explained hereinafter.

Firstly, after the processes until the formation of a desired pattern in the fifth embodiment are carried out, the processes which have been explained using FIGS. 4A to 4D and FIGS. 5A to 5D in the second embodiment are carried out, thereby forming a line-and-space pattern with a pitch of 40 nm and a line width of 20 nm on the first film 1 in the first region 6 and a pattern with a line width of 20 nm on the first film 1 in the second region 7.

Effect of the Sixth Embodiment

According to the sixth embodiment, the following effects are obtained in addition to the effects in the second and fifth embodiments.

Since the second resist material is exposed by the light with a wavelength not exposing the first resist material, it is possible to suppress damage or defects of the first resist pattern and to form a pattern having a size exceeding the exposure resolution limit of lithography.

Seventh Embodiment

The present embodiment is different from the other embodiments in that the photoreactivity of the first resist pattern is not deactivated and the second resist pattern is formed at a temperature in which dissolution inhibitor is not removed from the base resin of the first resist material.

In the present embodiment, as an example, a chemically-amplified ArF resist is used for the first resist material and a chemically-amplified KrF resist is used for the second resist material.

In addition, the wavelength of the light for exposing the first resist material and the temperature of the PEB are defined as v1 (193 nm) and C1 (130° C.) and the wavelength of the light for exposing the second resist material and the temperature of the PEB are defined as v2 (248 nm) and C2 (105° C.), then, the processes until the formation of a desired pattern in the fifth embodiment are carried out for forming a desired pattern.

Effect of the Seventh Embodiment

According to the seventh embodiment, the following effects are obtained.

(1) Since the first and second resist materials are made of materials having different reaction temperature ranges and the temperature in which the first resist material does not react can be selected as a temperature for performing the PEB on the second resist pattern, it is possible to suppress damage or defects of the first resist pattern due to the PEB at the time of forming the second pattern.

(2) Since it is possible to suppress damage or defects of the first resist pattern, the yield is improved.

(3) Since the reaction that the dissolution inhibitor is removed from the base resin of the first resist pattern does not occur during the PEB performed at the time of forming the second resist pattern, the alkali solubility does not appear, thus, it is possible to suppress damage or defects of the first resist pattern.

Eighth Embodiment

The present embodiment is different from the other embodiments in that, following the fabrication processes shown in the seventh embodiment, a line-and-space pattern having a size less than exposure resolution limit of lithography is formed. A process of forming a line-and-space pattern with a pitch of 40 nm and a line width of 20 nm in a first region will be explained hereinafter.

Firstly, after the processes until the formation of a desired pattern in the seventh embodiment are carried out, the processes which have been explained using FIGS. 4A to 4D and FIGS. 5A to 5D in the second embodiment are carried out, thereby forming a line-and-space pattern with a pitch of 40 nm and a line width of 20 nm on the first film 1 in the first region 6 and a pattern with a line width of 20 nm on the first film 1 in the second region 7.

Effect of the Eighth Embodiment

According to the eighth embodiment, the following effects are obtained in addition to the same effects in the second and seventh embodiments.

Since the PEB of the second resist material is performed at the temperature in which the first resist material reacts, it is possible to suppress damage or defects of the first resist pattern and to form a pattern having a size exceeding the exposure resolution limit of lithography.

Alternatively, the fifth to eighth embodiments may be combined. In other words, it is possible to suppress damage or defects of the first resist pattern at the time of forming the second resist pattern by performing the light irradiation and the PEB with a combination of the wavelength v and the temperature C by which the other materials are not exposed and does not react.

Ninth Embodiment

The present embodiment is different from the other embodiments in that a region for forming a first resist pattern is separated from a region for forming a second resist pattern so as not to overlap. A process of forming a line-and-space pattern with a pitch of 40 nm and a line width of 20 nm in a first region will be explained hereinafter.

FIGS. 8A to 8G are top views showing processes for fabricating a semiconductor device according to a ninth embodiment. FIGS. 9A to 9G are cross sectional views showing processes for fabricating the semiconductor device according to the ninth embodiment taken along the line IX-IX of FIGS. 8A to 8G.

Firstly, a first film 1, a workpiece film 2, a second film 3 and an organic antireflection film 4 are sequentially formed on a non-illustrated semiconductor substrate.

Next, a first resist pattern 5 is formed on the organic antireflection film 4 in the first region 6.

The photosensitive wavelength range of the first resist material for forming the first resist pattern 5 (e.g., a chemically-amplified ArF resist) is 175-210 nm as shown in FIG. 3A, and the reaction temperature range thereof by the PEB is 115-190° C. as shown in FIG. 3B. Onto the first resist material, for example, ArF excimer laser with a wavelength v1 (193 nm) is irradiated, subsequently, the PEB is performed by a hotplate which is set to a temperature C1 (130° C.).

Figure 8A:
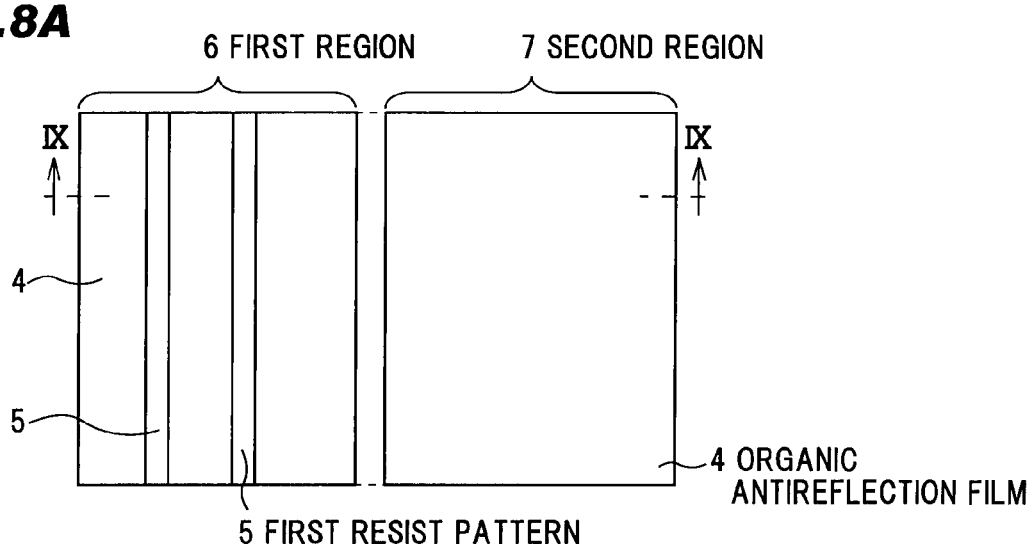
FIGS. 8A to 8G are top views showing processes for fabricating a semiconductor device according to a ninth embodiment.
Figure 9A:
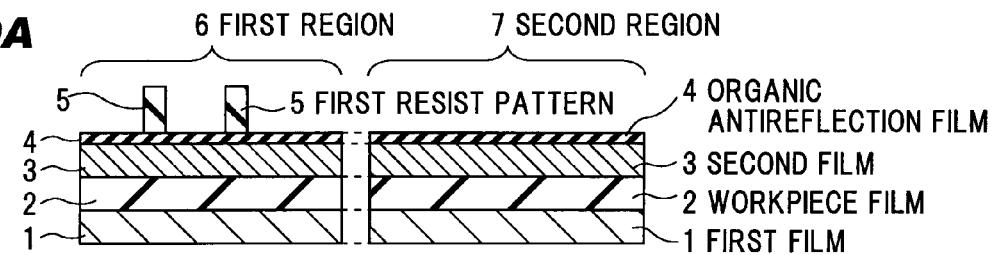
FIGS. 9A to 9G are cross sectional views showing processes for fabricating the semiconductor device according to the ninth embodiment taken along the line IX-IX of FIGS. 8A to 8G.

Next, as shown in FIGS. 8A and 9A, the line width of the first resist pattern 5 is slimmed to 20 nm, thereby forming the first resist pattern 5 with a line width of 20 nm.

Figure 8B:
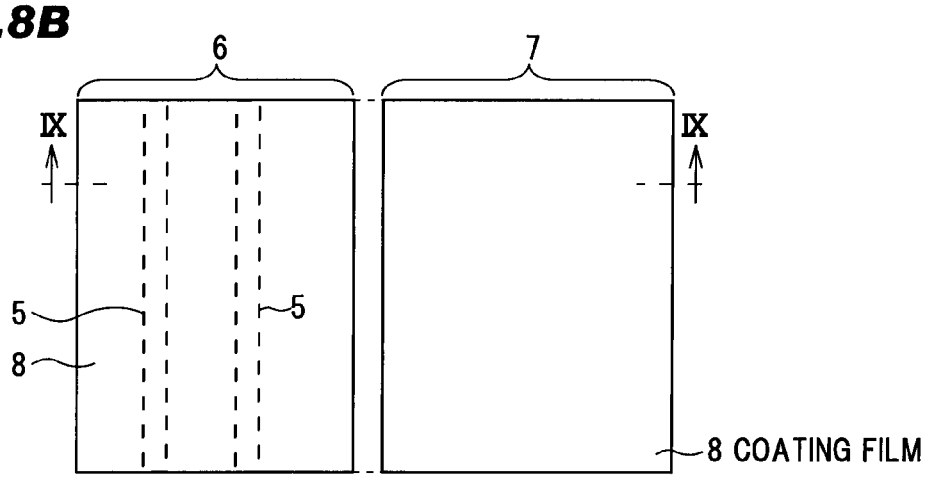
Figure 9B:
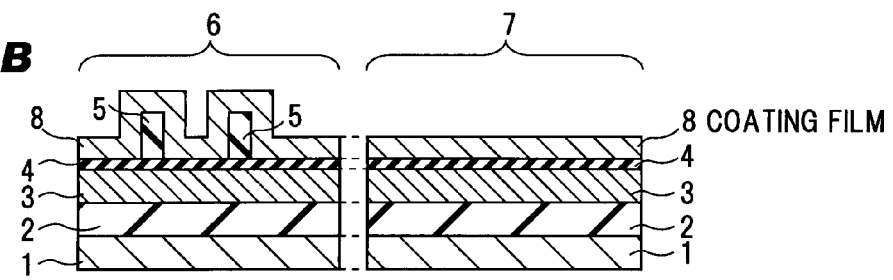

Next, as shown in FIGS. 8B and 9B, the coating film 8 is formed on the first region 6 and the second region 7.

Figure 8C:
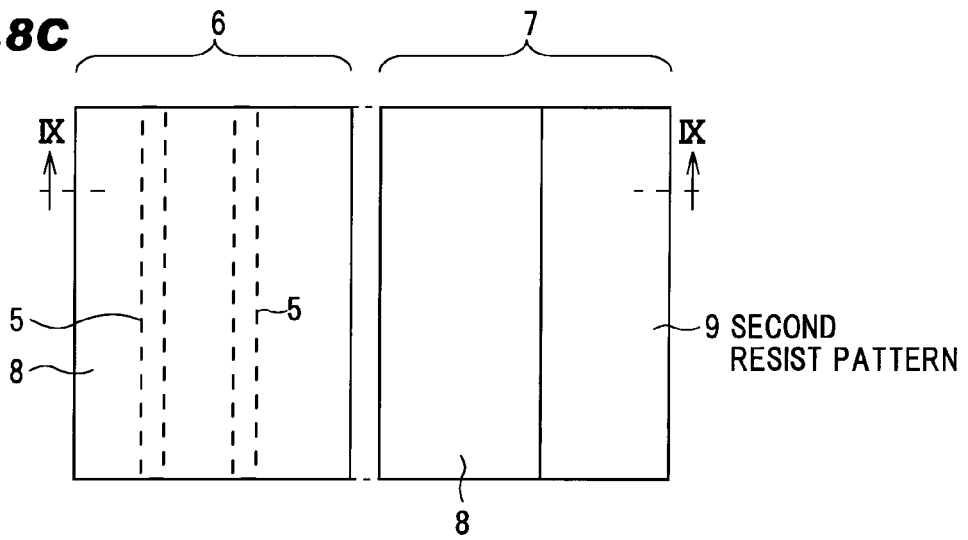
Figure 9C:
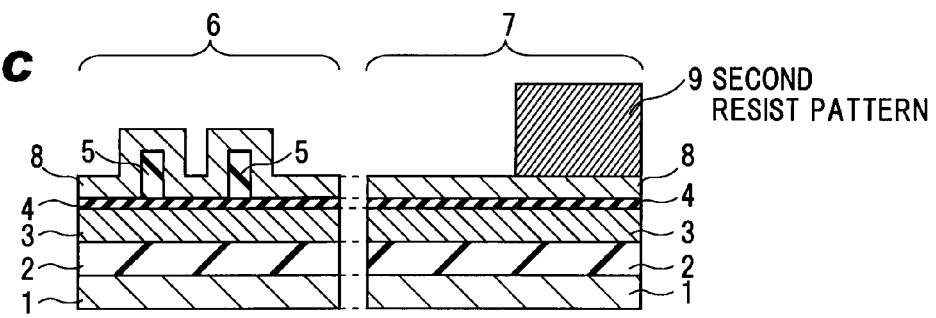

Next, as shown in FIGS. 8C and 9C, the second resist pattern 9 is formed on the coating film 8 in the second region 7 using a second resist material made of a material different from the first resist material (e.g., a chemically-amplified KrF resist).

Here, the photosensitive wavelength range of the second resist material for forming the second resist pattern 9 is 220-275 nm as shown in FIG. 3A, and the reaction temperature range thereof by the PEB is 80-190° C. as shown in FIG. 3B. On the second resist material, for example, KrF excimer laser with a wavelength ν2 (248 nm) is irradiated, and subsequently, the PEB is performed by a hot plate which is set to the temperature C2 (105° C.).

Since the first resist pattern 5 and the second resist pattern 9 are formed in the different regions, it is possible to separate a region for performing the light irradiation so that damage or defects are not generated in the first resist pattern 5 when the second resist pattern 9 is formed.

Figure 8D:
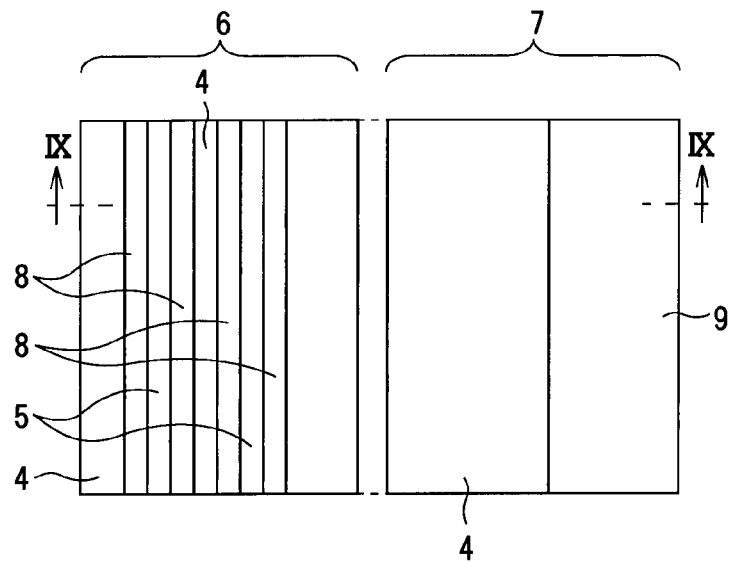
Figure 9D:
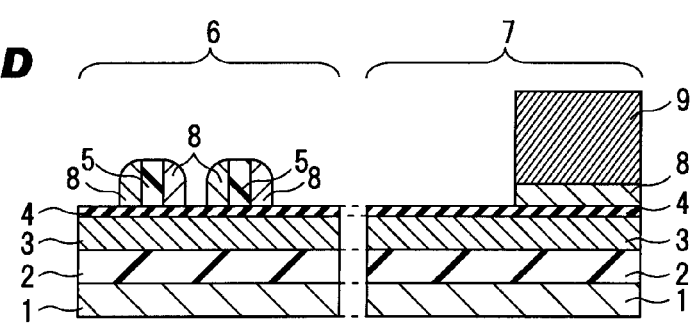

Next, as shown in FIGS. 8D and 9D, the coating film 8 is etched back about 20 nm for exposing the first resist pattern 5.

Figure 8E:
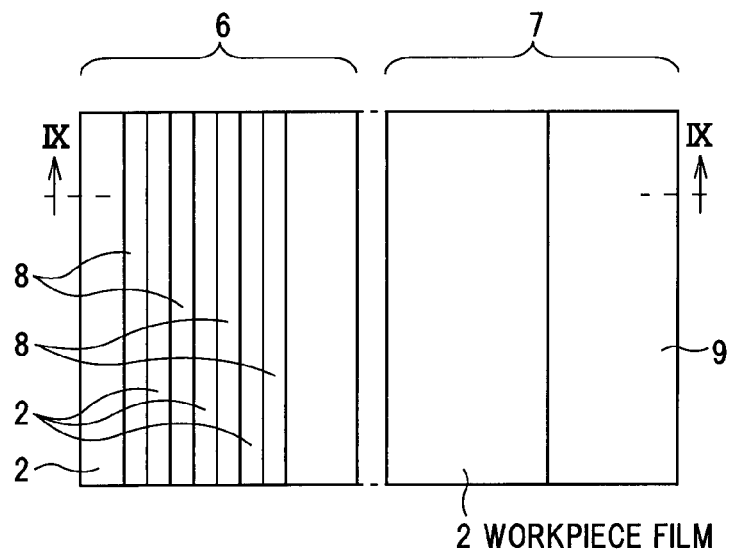
Figure 9E:
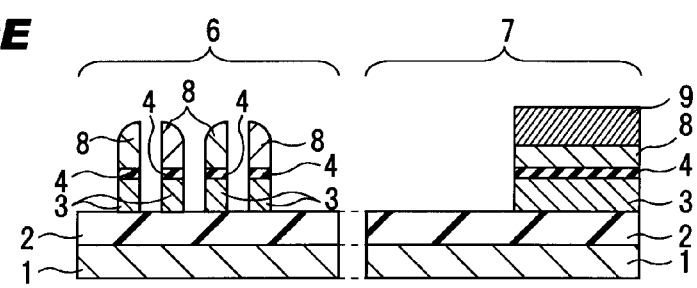

Next, as shown in FIGS. 8E and 9E, the first resist pattern 5, the organic antireflection film 4 and the second film 3 are, e.g., simultaneously anisotropically etched under the same processing conditions using plasma containing oxygen. At this time, the second resist pattern 9 shown in FIG. 9E is also etched.

Figure 8F:
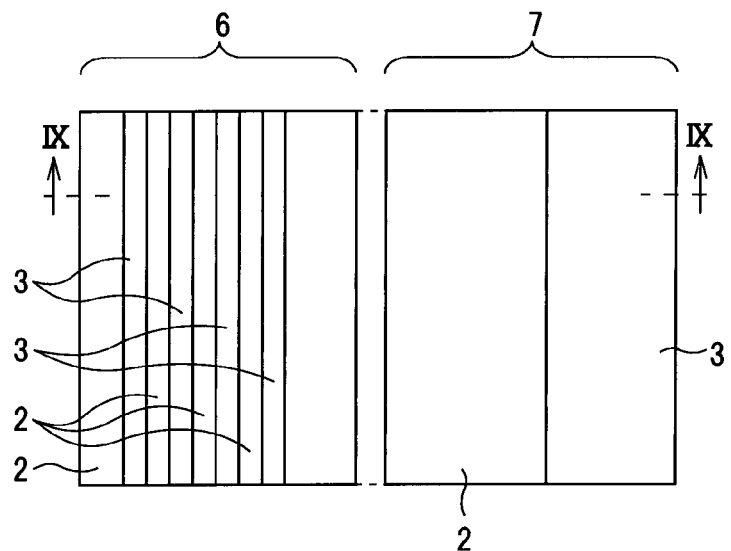
Figure 9F:
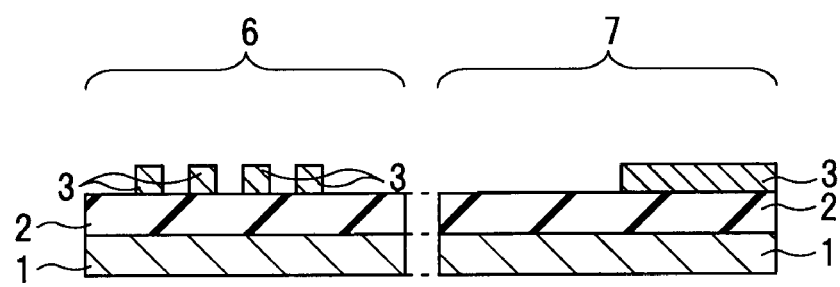

Next, as shown in FIGS. 8F and 9F, after the second resist pattern 9 is removed, the coating film 8 and the organic antireflection film 4 are removed. As a result, a line-and-space pattern with a pitch of 40 nm and a line width of 20 nm, in which an aspect ratio is high and a pattern falling is suppressed, is formed by the second film 3 in the first region 6, and a large pattern is formed in the second region 7.

Figure 8G:
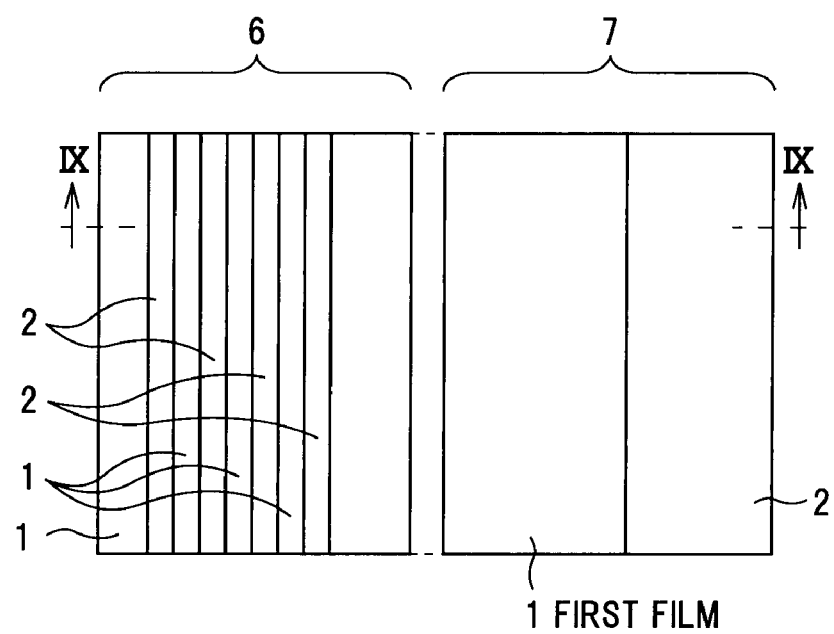
Figure 9G:
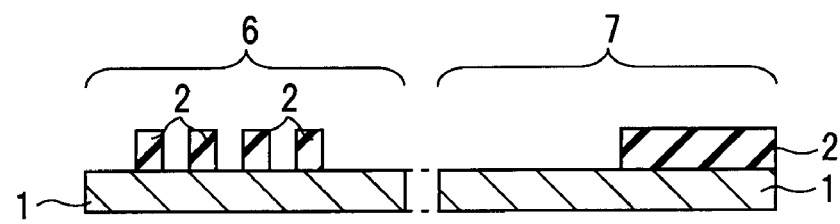

Next, as shown in FIGS. 8G and 9G, the pattern is transferred to the workpiece film 2 by dry etching using the second film 3 as a mask. Following this, the second film 3 is removed by, e.g., an oxygen asking method and a line-and-space pattern with a pitch of 40 nm and a line width of 20 nm is formed on the first film 1 in the first region 6. Meanwhile, a large pattern is formed on the first film 1 in the second region 7.

Effect of the Ninth Embodiment

According to the ninth embodiment, the following effects are obtained in addition to the same effects in the second embodiment.

By forming the first and second resist patterns in the different regions, it is possible to suppress damage or defects of the first resist pattern at the time of forming the second resist pattern and to form a pattern having a size exceeding the exposure resolution limit of lithography.

Note that, a process of deactivating the photoreactivity of PAG contained in the first resist pattern by irradiating the light with a photosensitive wavelength of the first resist pattern described in the first to fifth embodiments may be added after the process of forming the first resist pattern.

Tenth Embodiment

The present embodiment is different from the other embodiment in that a cross-linked film for cross-linking with the first resist material is formed as a coating film. A process of forming a line-and-space pattern with a pitch of 40 nm and a line width of 20 nm in a first region will be explained hereinafter.

FIGS. 10A to 10I are top views showing processes for fabricating a semiconductor device according to a tenth embodiment. FIGS. 11A to 11I are cross sectional views showing processes for fabricating the semiconductor device according to the tenth embodiment taken along the line XI-XI of FIGS. 10A to 10I.

Firstly, a first film 1, a workpiece film 2, a second film 3 and an organic antireflection film 4 are sequentially formed on a non-illustrated semiconductor substrate.

Next, a first resist pattern 5 is formed on the organic antireflection film 4 in the first region 6 and the second region 7.

The photosensitive wavelength range of the first resist material for forming the first resist pattern 5 (e.g., a chemically-amplified ArF resist) is 175-210 nm as shown in FIG. 3A, and the reaction temperature range thereof by the PEB is 115-190° C. as shown in FIG. 3B. On the first resist material, for example, ArF excimer laser with a wavelength ν1 (193 nm) is irradiated, and subsequently, the PEB is performed by a hot plate which is set to a temperature C1 (130° C.).

Figure 10D:
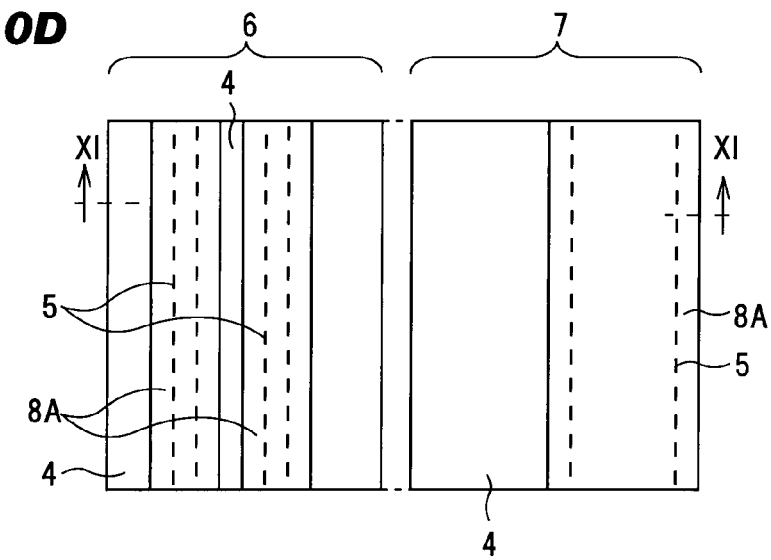
Figure 11A:
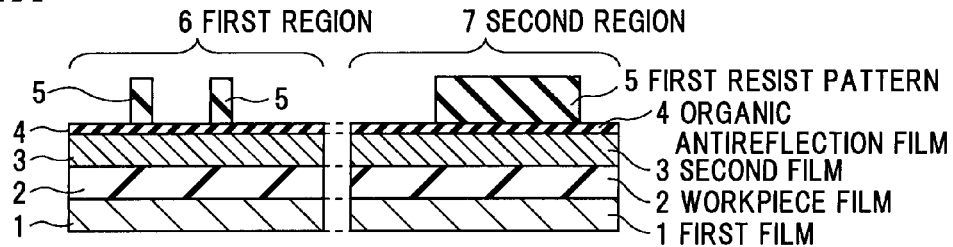
FIGS. 11A to 11I are cross sectional views showing processes for fabricating the semiconductor device according to the tenth embodiment taken along the line XI-XI of FIGS. 10A to 10I.

Next, as shown in FIGS. 10A and 11A, the line width of the first resist pattern 5 in the first region 6 and the second region 7 is slimmed to 20 nm. The line width of the first resist pattern 5 in the first region 6 becomes 20 nm by the slimming.

Figure 11B:
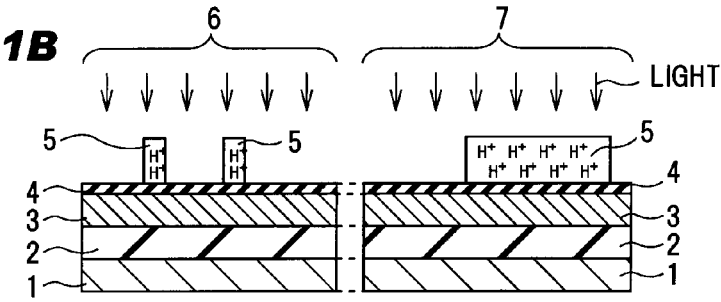

Next, as shown in FIGS. 10B and 11B, the ArF excimer laser with a wavelength ν1 (193 nm) is irradiated on the first resist pattern 5. "H$^+$" shown in the first resist pattern 5 represents acid generated in the first resist pattern 5 by the irradiation of the light.

Figure 11C:
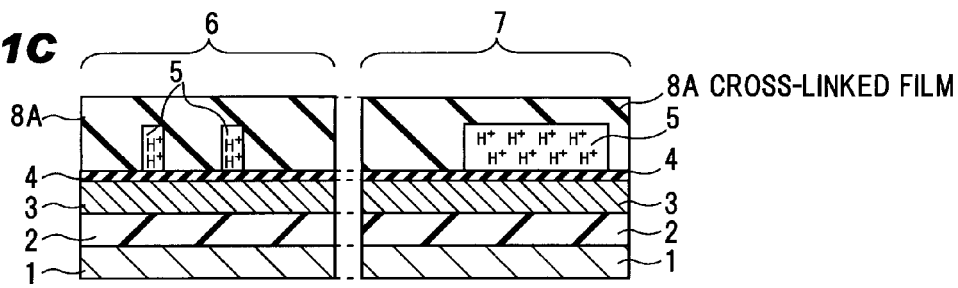

Next, as shown in FIGS. 10C and 11C, a cross-linked film 8A as a coating film is formed in first region 6 and the second region 7. The cross-linked film 8A is made of silicon containing compound such as silane compound, silazane compound or siloxane compound, etc., to be more precise, SOG material, polysilane compound, polysilazane compound or silicon containing negative resist, etc.

Figure 11D:
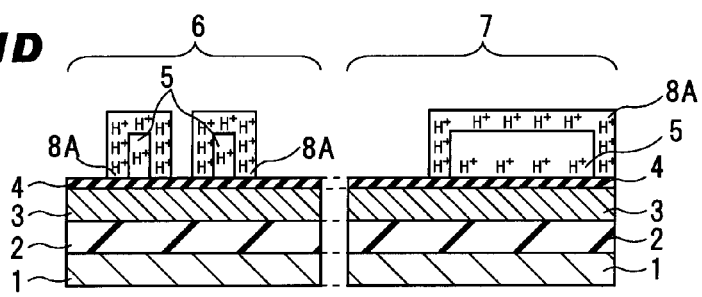

Next, as shown in FIGS. 10D and 11D, the cross-linked film 8A is cross-linked around the first resist pattern 5 by performing the baking process.

At this time, the cross-linked film 8A is cross-linked around the first resist pattern 5 using the acid in the first resist pattern 5. The acid generated in the first resist pattern 5 is consumed by the cross-linkage of the cross-linked film 8A, and it is thereby possible to suppress dust, etc., generated in the coating film due to the generation of the acid.

Figure 10E:
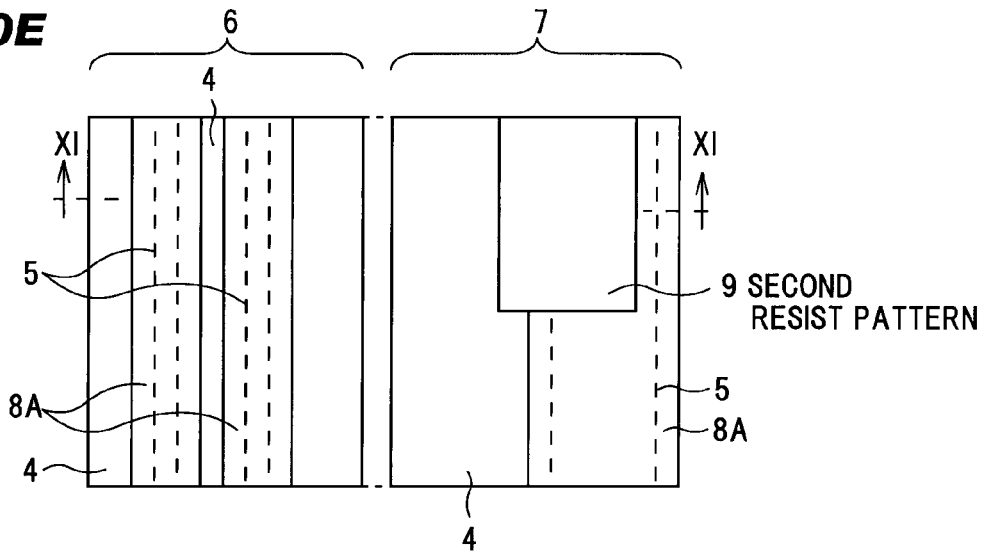
Figure 11E:
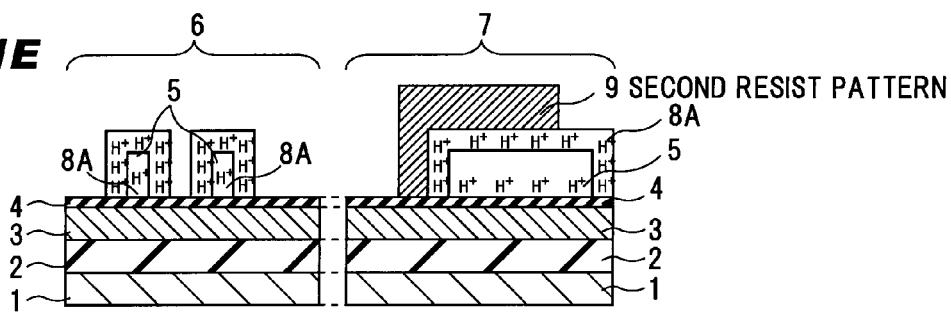

Next, as shown in FIGS. 10E and 11E, the second resist pattern 9 is formed in the second region 7 by a second resist material made of a material different from the first resist material (e.g., a chemically-amplified KrF resist).

Here, the photosensitive wavelength range of the second resist material for forming the second resist pattern 9 is 220-275 nm as shown in FIG. 3A, and the reaction temperature range thereof by the PEB is 80-190° C. as shown in FIG. 3B. On the second resist material, for example, KrF excimer laser with a wavelength ν2 (248 nm) is irradiated, and subsequently, the PEB is performed by a hot plate which is set to the temperature C2 (105° C.).

Next, unnecessary portions of the coating film 8 and the first resist pattern 5 are removed by plasma containing fluorine using the second resist pattern 9 as a mask.

Figure 10F:
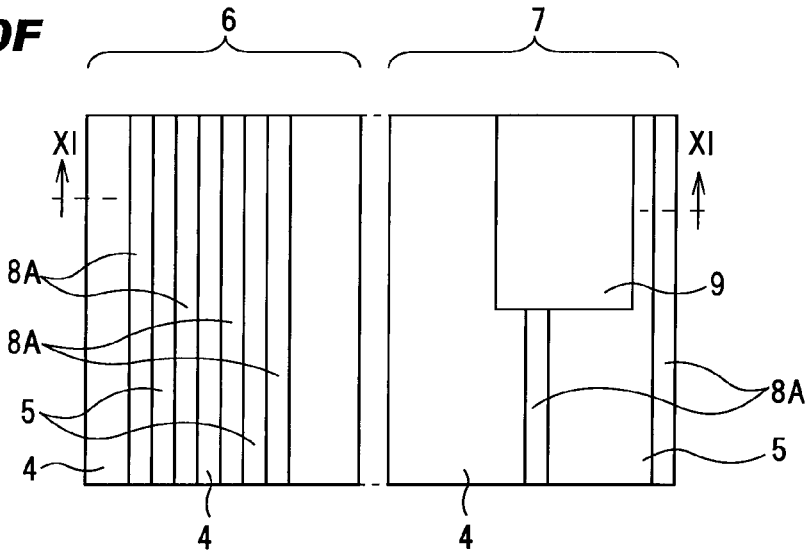
Figure 11F:
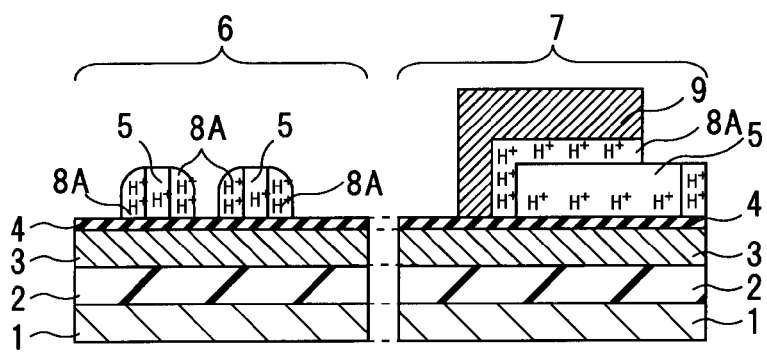

Next, as shown in FIGS. 10F and 11F, the cross-linked film 8A is etched back about 20 nm for exposing the first resist pattern 5.

Figure 10G:
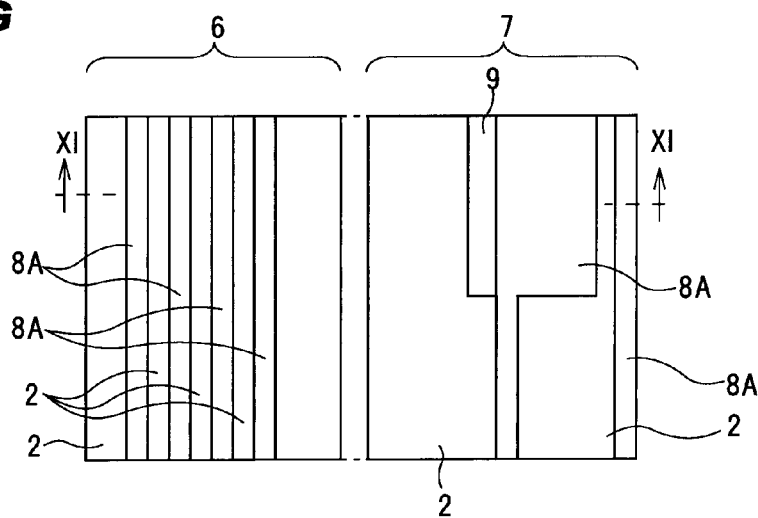
Figure 11G:
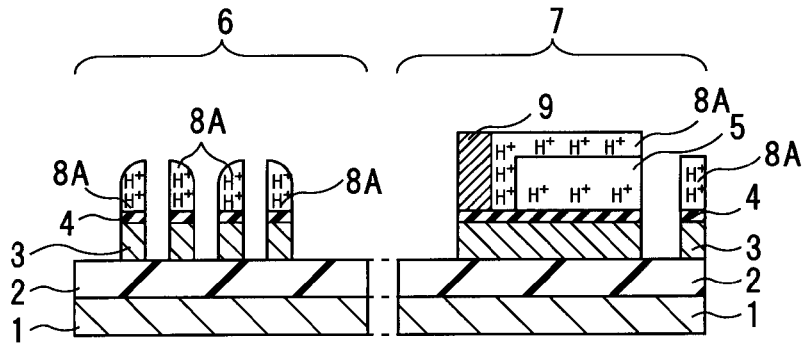

Next, as shown in FIGS. 10G and 11G, the first resist pattern 5, the organic antireflection film 4 and the second film 3 are, e.g., simultaneously anisotropically etched under the same processing conditions using plasma containing oxygen.

Figure 10H:
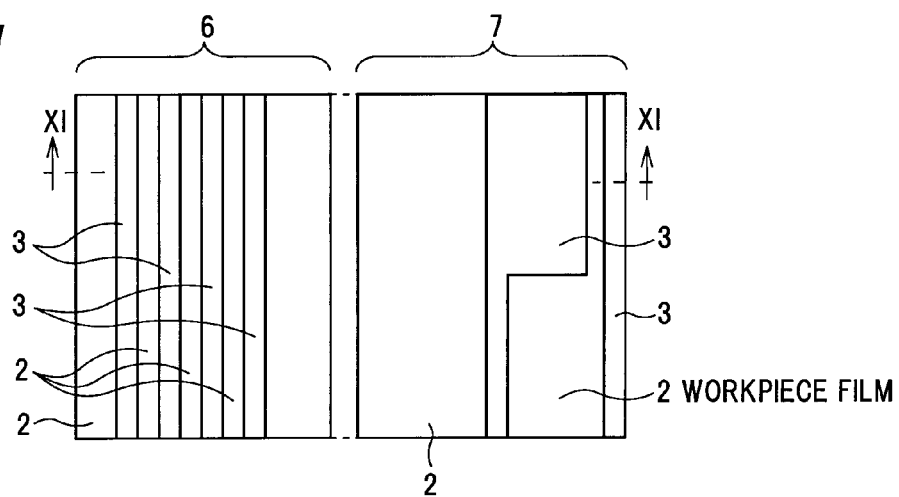
Figure 11H:
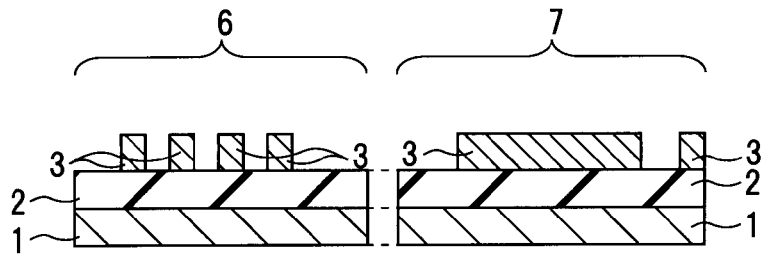

Next, as shown in FIGS. 10H and 11H, the cross-linked film 8A, the organic antireflection film 4 and the second resist pattern 9 are removed. As a result, a line-and-space pattern with a pitch of 40 nm and a line width of 20 nm, in which an aspect ratio is high and a pattern falling is suppressed, is formed by the second film 3 in the first region 6. Meanwhile, a large pattern and a pattern with a line width of 20 nm by the second film 3 in which an aspect ratio is high and a pattern falling is suppressed are formed in the second region 7.

Figure 10I:
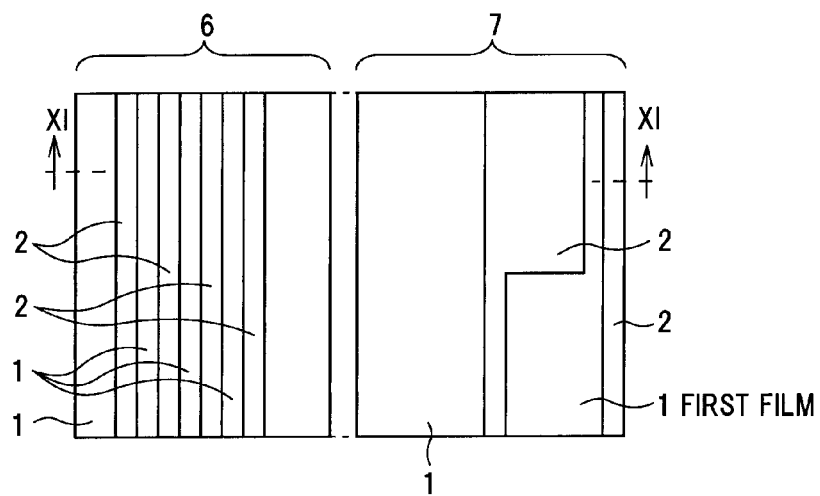
Figure 11I:
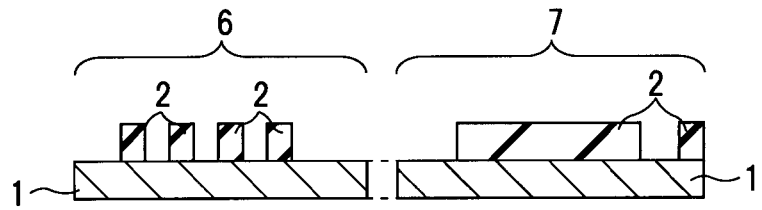

Next, as shown in FIGS. 10I and 11I, the pattern is transferred to the workpiece film 2 by dry etching using the second film 3 as a mask. Following this, the second film 3 is removed by, e.g., an oxygen ashing method and a line-and-space pattern with a pitch of 40 nm and a line width of 20 nm is formed on the first film 1 in the first region 6. Meanwhile, a large pattern and a pattern with a line width of 20 nm are formed on the first film 1 in the second region 7.

Effect of the Tenth Embodiment

According to the tenth embodiment, the following effects are obtained in addition to the same effects in the second embodiment.

By cross-linking the cross-linked film using the acid generated in the first resist pattern, it is possible to suppress damage or defects of the first resist pattern at the time of forming the second resist pattern and to form a pattern having a size exceeding the exposure resolution limit of lithography.

Other Embodiments

It should be noted that the present invention is not limited to the embodiments described above, and the various combinations and changes may be made without departing from or changing the technical idea of the present invention.

For example, in the third embodiment (the exposure to the nitrogen-containing compound after the light irradiation), a process of performing the baking process within a reaction temperature range where the first resist material reacts may be added after the process of exposing the first resist pattern to the nitrogen-containing compound.

Alternatively, for example, in the third embodiment, a process of cleaning by pure water or organic solvent not dissolving the first resist pattern may be added after the process of exposing the first resist pattern to the nitrogen-containing compound.

Alternatively, for example, in the third embodiment, a process of cleaning by pure water or organic solvent not dissolving the first resist pattern and a process of performing the baking process within a reaction temperature range where the first resist material reacts may be added after the process of exposing the first resist pattern to the nitrogen-containing compound.

In addition, for example, although the lights with different wavelengths are irradiated on the first and second resist materials in the fifth embodiment and the PEB is performed on the first and second resist materials at the different temperatures in the seventh embodiment, the irradiation of the light with different wavelengths and the PEB at the different temperatures may be performed on first and second resist materials.

In addition, although the chemically-amplified ArF resist is used as the first resist material and the chemically-amplified KrF resist is used as the second resist material in the above-mentioned embodiments, it is not limited thereto, and it is acceptable as long as it is a combination of the resist materials having different photosensitive ranges or different reaction temperature ranges. Similarly to this, although the ArF excimer laser and the KrF excimer laser are used as an energy beam irradiated thereon, it is not limited thereto, and it may be a g-line (wavelength of 435 nm), an i-line (wavelength of 365 nm), a F2 laser (wavelength of 157 nm), EUV (Extreme Ultra Violet: wavelength of 13.6 nm) or electron beam, etc., depending on the resist material to be used.

What is claimed is:

1. A method of fabricating a semiconductor device, comprising:
    forming a first resist pattern comprising a first resist material on a workpiece material;
    irradiating an energy beam on the first resist pattern, the energy beam exposing the first resist material to light;
    performing a treatment for improving resistance of the first resist pattern after the irradiation of the energy beam;
    forming a coating film on the workpiece material so as to cover the first resist pattern;
    forming a second resist pattern comprising a second resist material on the coating film after the treatment; and
    etching the coating film by using the second resist pattern as a mask.

2. The method of fabricating a semiconductor device according to claim 1, wherein the treatment is a baking process of the first resist pattern.

3. The method of fabricating a semiconductor device according to claim 2, wherein the second resist material comprises a material with a photosensitive wavelength and/or a reaction temperature different from those of the first resist material.

4. The method of fabricating a semiconductor device according to claim 3, comprising:
    slimming the first resist pattern.

5. The method of fabricating a semiconductor device according to claim 4, wherein a sidewall pattern is formed by performing a process of leaving the coating film as a sidewall of the first resist pattern.

6. The method of fabricating a semiconductor device according to claim 5, comprising:
    cutting a closed loop pattern of the sidewall pattern using the second resist pattern as a mask.

7. The method of fabricating a semiconductor device according to claim 6, wherein the coating film comprises a material cross-linked by acid generated in the first resist pattern after the baking process.

8. The method of fabricating a semiconductor device according to claim 1, wherein the treatment is an exposure of the first resist pattern to a nitrogen-containing compound.

9. The method of fabricating a semiconductor device according to claim 8, wherein the second resist material comprises a material with a photosensitive wavelength and/or a reaction temperature different from those of the first resist material.

10. The method of fabricating a semiconductor device according to claim 9, comprising:
    slimming the first resist pattern.

11. The method of fabricating a semiconductor device according to claim 10, wherein a sidewall pattern is formed by performing a process of leaving the coating film as a sidewall of the first resist pattern.

12. The method of fabricating a semiconductor device according to claim 11, comprising:
    cutting a closed loop pattern of the sidewall pattern using the second resist pattern as a mask.

13. A method of fabricating a semiconductor device, comprising:
    forming a first resist material on a workpiece material and irradiating an energy beam within a first photosensitive range on the first resist material, thereby forming a first resist pattern;
    forming a coating film on the workpiece material so as to cover the first resist pattern;

forming a second resist material on the coating film, a material of the second resist material being different from that of the first resist material, and irradiating an energy beam within a second photosensitive range on the second resist material, the second photosensitive range being different from the first photosensitive range, thereby forming a second resist pattern; and etching the coating film by using the second resist pattern as a mask.

14. The method of fabricating a semiconductor device according to claim 13, comprising:

slimming the first resist pattern.

15. The method of fabricating a semiconductor device according to claim 14, wherein a sidewall pattern is formed by performing a process of leaving the coating film as a sidewall of the first resist pattern.

16. The method of fabricating a semiconductor device according to claim 15, comprising:

cutting a closed loop pattern of the sidewall pattern using the second resist pattern as a mask.

17. A method of fabricating a semiconductor device, comprising:

forming a first resist material on a workpiece material, irradiating an energy beam thereon and performing a baking process of the first resist material within a first temperature range, thereby forming a first resist pattern;

forming a coating film on the workpiece material so as to cover the first resist pattern;

forming a second resist material on the coating film, a material of the second resist material being different from that of the first resist material, irradiating an energy beam thereon and performing a baking process of the second resist material within a second temperature range, thereby forming a second resist pattern; and etching the coating film by using the second resist pattern as a mask.

18. The method of fabricating a semiconductor device according to claim 17, comprising:

slimming the first resist pattern.

19. The method of fabricating a semiconductor device according to claim 18, wherein a sidewall pattern is formed by performing a process of leaving the coating film as a sidewall of the first resist pattern.

20. The method of fabricating a semiconductor device according to claim 19, comprising:

cutting a closed loop pattern of the sidewall pattern using the second resist pattern as a mask.

* * * * *